(12) United States Patent
Shah et al.

(10) Patent No.: US 11,383,295 B2
(45) Date of Patent: Jul. 12, 2022

(54) ARCUATE SEED CASTING METHOD

(71) Applicant: Raytheon Technologies Corporation, Farmington, CT (US)

(72) Inventors: Dilip M. Shah, Glastonbury, CT (US); Steven J. Bullied, Pomfret, CT (US); Ryan C. Breneman, Newington, CT (US); Shiela R. Woodard, South Windsor, CT (US); Carl R. Verner, Windsor, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 17/062,031

(22) Filed: Oct. 2, 2020

(65) Prior Publication Data

US 2021/0101205 A1    Apr. 8, 2021

Related U.S. Application Data

(60) Provisional application No. 62/936,192, filed on Nov. 15, 2019, provisional application No. 62/911,121, filed on Oct. 4, 2019.

(51) Int. Cl.
*B22D 27/04* (2006.01)
*C30B 11/14* (2006.01)
*C30B 29/52* (2006.01)

(52) U.S. Cl.
CPC ........... *B22D 27/04* (2013.01); *B22D 27/045* (2013.01); *C30B 11/14* (2013.01); *C30B 29/52* (2013.01)

(58) Field of Classification Search
CPC ............................ B22D 27/04; B22D 27/045
See application file for complete search history.

(56) References Cited

U.S. PATENT DOCUMENTS

| 4,289,570 | A  | 9/1981  | Terkelsen          |
|-----------|----|---------|--------------------|
| 4,412,577 | A  | 11/1983 | Salkeld et al.     |
| 4,469,161 | A  | 9/1984  | Higginbotham et al.|
| 4,580,613 | A  | 4/1986  | Miller et al.      |
| 6,969,240 | B2 | 11/2005 | Strangman          |

(Continued)

FOREIGN PATENT DOCUMENTS

| EP | 0126550 A1  | 11/1984 |
|----|-------------|---------|
| EP | 1728971 A1  | 12/2006 |

(Continued)

OTHER PUBLICATIONS

European Search Report dated Dec. 2, 2020 for European Patent Application No. 20200143.4.

(Continued)

*Primary Examiner* — Kevin E Yoon
(74) *Attorney, Agent, or Firm* — Bachman & LaPointe, P.C.

(57) ABSTRACT

A casting method includes forming a seed. The seed has a first end and a second end and an inner diameter (ID) surface and an outer diameter (OD) surface. The seed second end is placed in contact or spaced facing relation with a chill plate. The first end is contacted with molten material. The molten material is cooled and solidified so that a crystalline structure of the seed propagates into the solidifying material. At least a portion of the seed contacted with the molten material has a solidus higher than a solidus of at least an initial pour portion of the molten material.

17 Claims, 15 Drawing Sheets

(56) References Cited

U.S. PATENT DOCUMENTS

| | | | |
|---|---|---|---|
| 7,204,294 | B2 | 4/2007 | Jennings et al. |
| 8,206,117 | B2 | 6/2012 | Strangman et al. |
| 8,382,899 | B2 | 2/2013 | D'Souza et al. |
| 9,144,842 | B2 | 9/2015 | Feng et al. |
| 10,035,185 | B2 | 7/2018 | Shah et al. |
| 10,369,625 | B2 | 8/2019 | Shah et al. |
| 2014/0363305 | A1* | 12/2014 | Shah .................. F01D 5/14 |
| | | | 164/122.2 |
| 2015/0075745 | A1* | 3/2015 | Marcin, Jr. ............ B22D 30/00 |
| | | | 164/151.4 |

FOREIGN PATENT DOCUMENTS

| | | |
|---|---|---|
| FR | 3042725 A1 | 4/2017 |
| JP | H0292888 A | 4/1990 |
| RU | 2185929 C2 | 7/2002 |

OTHER PUBLICATIONS

European Search Report dated Dec. 2, 2020 for European Patent Application No. 20200135.0.
European Search Report dated Dec. 2, 2020 for European Patent Application No. 20200138.4.

\* cited by examiner

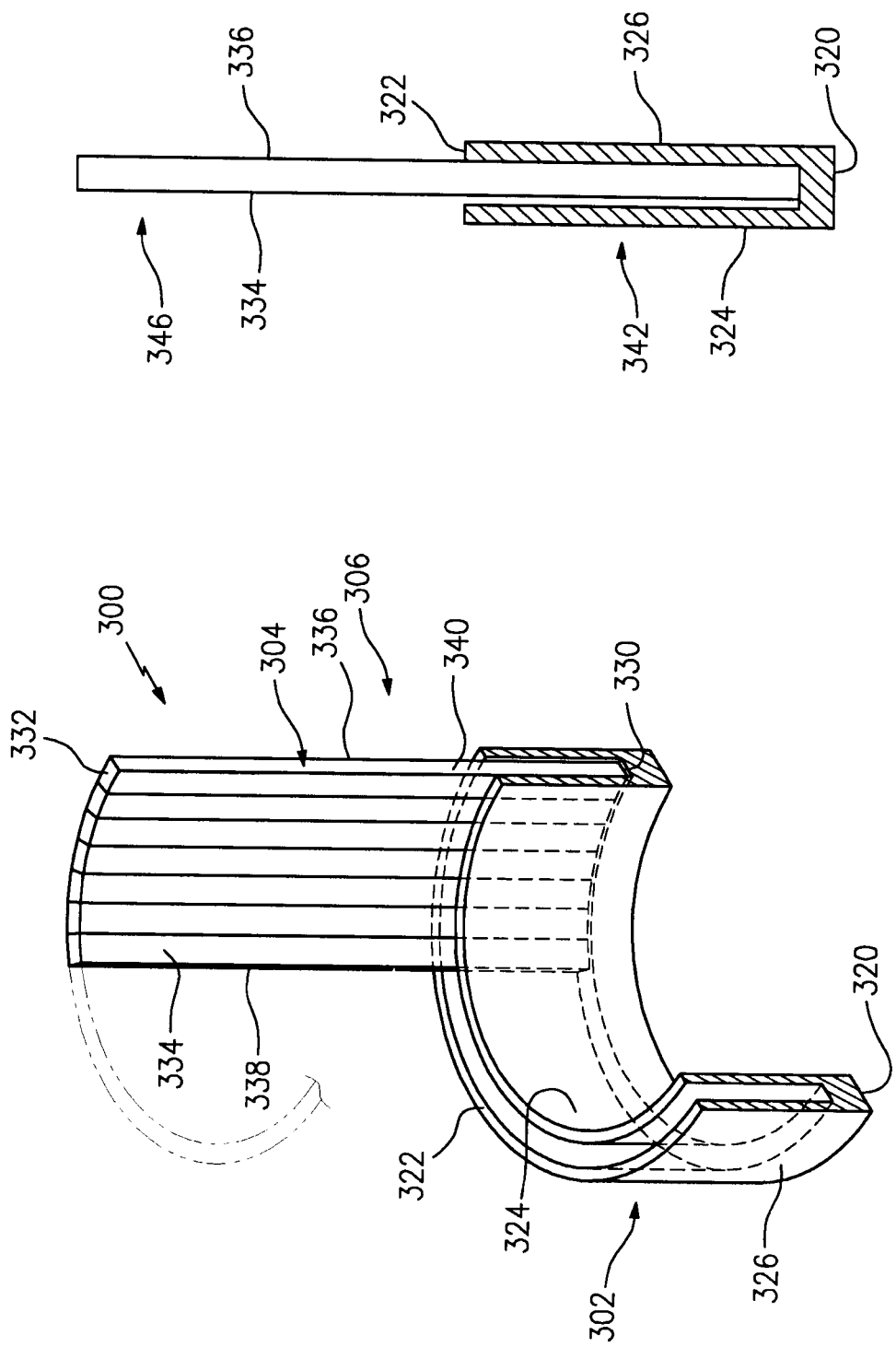

ARCUATE SEED CASTING METHOD

CROSS-REFERENCE TO RELATED APPLICATIONS

Benefit is claimed of U.S. Patent Application No. 62/911,121, filed Oct. 4, 2019, and entitled "Arcuate Seed Casting Method" and U.S. Patent Application No. 62/936,192, filed Nov. 15, 2019, and entitled "Arcuate Seed Casting Method", the disclosures of which are incorporated by reference herein in their entireties as if set forth at length.

BACKGROUND

The disclosure relates to gas turbine engines. More particularly, the disclosure relates to manufacture of disks and other annular components.

In typical manufacture of nickel-based superalloy disks (e.g., for gas turbine engine turbine sections or high pressure compressor (HPC) sections), manufacture is by forging of powder metallurgical (PM) or cast forms.

In distinction, only casting techniques are typically used to form blades, vanes, and combustor panels. Many blades are manufactured by single crystal casting techniques. In an exemplary single crystal casting technique, a seed of single crystal material is used to define a crystalline orientation that propagates into the cast blade alloy as it cools and solidifies.

In casting blades, etc., it is well known that removal of high angle grain boundaries (>10°) in single crystal nickel base superalloys leads to improved creep resistance and consequently enhances its temperature capability. In addition, it is also known that by properly orienting the low modulus <100> direction along the direction in which high thermal strain exists, the thermal mechanical fatigue (TMF) capability of the material can also be significantly improved.

However, direct application of nickel base superalloy single crystal to a component such as a turbomachine disk, shaft, spacer, or the like, has not been practical. This is so because loading of such components due to high rotation speed around an axis is axially symmetric and will lead to uneven strain distribution in a single crystal body, with cubic symmetry and anisotropic elastic and plastic properties.

U.S. Pat. No. 10,369,625, of Shah et al., Aug. 6, 2019, and entitled "Arcuate directionally solidified components and manufacture methods", (the '625 patent, the disclosure of which is incorporated by reference herein in its entirety as if set forth at length) discloses use of an arcuate seed to cast arcuate components. For example, an annular seed may be used to cast an annular component such as a disk shaft, spacer, or the like.

SUMMARY

One aspect of the disclosure involves a casting method comprising: forming a seed, the seed having a first end and a second end, the forming including bending a seed precursor; placing the seed second end in contact or spaced facing relation with a chill plate; contacting the first end with molten material; and cooling and solidifying the molten material so that a crystalline structure of the seed propagates into the solidifying material. The forming further comprises reducing a thickness of the seed proximate the first end relative to a thickness of the seed proximate the second end.

A further embodiment of any of the foregoing embodiments or aspects may additionally and/or alternatively include the seed and the molten material being nickel-based superalloys.

A further embodiment of any of the foregoing embodiments or aspects may additionally and/or alternatively include the solidus of the seed being no more than 25° C. higher, if at all, than the solidus of an initial pour portion of the molten material.

A further embodiment of any of the foregoing embodiments or aspects may additionally and/or alternatively include the seed and the molten material being nickel-based superalloys.

A further embodiment of any of the foregoing embodiments or aspects may additionally and/or alternatively include the reducing comprising electrical discharge machining (EDM).

A further embodiment of any of the foregoing embodiments or aspects may additionally and/or alternatively include the reducing being before the bending.

A further embodiment of any of the foregoing embodiments may additionally and/or alternatively include the reducing being after the bending.

A further embodiment of any of the foregoing embodiments or aspects may additionally and/or alternatively include the reducing being along an inner diameter face and an outer diameter face of the seed.

A further embodiment of any of the foregoing embodiments or aspects may additionally and/or alternatively include the reducing being at a plurality of locations circumferentially spaced in the ultimate bent seed.

A further embodiment of any of the foregoing embodiments or aspects may additionally and/or alternatively include the reducing creating a through cut at each of the locations, optionally open to the first end of the seed.

A further embodiment of any of the foregoing embodiments or aspects may additionally and/or alternatively include the molten material solidifying in an annular form.

Another aspect of the disclosure involves a casting method comprising: forming a seed, the seed having a first end and a second end, the forming including bending a seed precursor; placing the seed second end in contact or spaced facing relation with a chill plate; contacting the first end with molten material; and cooling and solidifying the molten material so that a crystalline structure of the seed propagates into the solidifying material. The forming further comprises reducing a thickness of the bent seed precursor by removing at least 20% of the precursor thickness from both an inner diameter surface and an outer diameter surface.

Another aspect of the disclosure involves a casting method comprising: forming a seed, the seed having a first end and a second end, the forming including bending a seed precursor; placing the seed second end in contact or spaced facing relation with a chill plate; contacting the first end with molten material; and cooling and solidifying the molten material so that a crystalline structure of the seed propagates into the solidifying material. The forming further comprises reducing a thickness of the seed precursor at a plurality of spaced locations.

A further embodiment of any of the foregoing embodiments or aspects may additionally and/or alternatively include the reduced thickness facilitating the bending.

A further embodiment of any of the foregoing embodiments or aspects may additionally and/or alternatively include at least one of: the reduced thickness being along a full height of the seed between the first end and the second end; the reducing of the thickness being at nineteen or more locations; and the bending at least partially closing grooves at the locations.

A further embodiment of any of the foregoing embodiments or aspects may additionally and/or alternatively include at least one of: the reduced thickness being along only a partial height of the seed between the first end and the second end; the reduced thickness relieving stress in the seed precursor proximate the first end; the reducing of the thickness being at nineteen or more locations; and the reducing of the thickness being after the bending.

A further embodiment of any of the foregoing embodiments or aspects may additionally and/or alternatively include the spaced locations including first locations on a first face of the seed precursor and second locations on a second face of the seed precursor, the first locations circumferentially offset from the second locations in the seed.

Another aspect of the disclosure involves a casting method comprising: forming a seed, the seed having a first end and a second end, the forming including bending a seed precursor; placing the seed second end in contact or spaced facing relation with a chill plate; contacting the first end with molten material; and cooling and solidifying the molten material so that a crystalline structure of the seed propagates into the solidifying material. The forming further comprises at least one of: rendering a portion of the seed precursor proximate the first end less prone to stress from the bending than a portion of the seed precursor proximate the second end; relieving a stress in the seed proximate the first end relative to a stress in the seed proximate the second end; and removing stressed material in the seed proximate the first end relative to stressed material in the seed proximate the second end.

A further embodiment of any of the foregoing embodiments or aspects may additionally and/or alternatively include: the forming including said rendering; and said rendering comprising removing material.

A further embodiment of any of the foregoing embodiments or aspects may additionally and/or alternatively include the forming including said relieving and said relieving comprising removing material.

Another aspect of the disclosure involves a casting method comprising: forming a seed, the seed having a first end and a second end, the forming including bending a seed precursor; placing the seed second end in contact or spaced facing relation a chill plate; contacting the first end with molten material; and cooling and solidifying the molten material so that a crystalline structure of the seed propagates into the solidifying material. The forming further comprises inserting the bent seed precursor into a sleeve leaving the bent seed precursor protruding from a first end of the sleeve.

A further embodiment of any of the foregoing embodiments or aspects may additionally and/or alternatively include the sleeve holding the bent seed precursor compressed.

A further embodiment of any of the foregoing embodiments or aspects may additionally and/or alternatively include the sleeve having a second end, the bent seed precursor has a first end and a second end, the protruding being of a portion of the bent seed precursor proximate the first end of the bent seed precursor, the second end of the bent seed precursor captured by an internal shoulder of the sleeve.

A further embodiment of any of the foregoing embodiments or aspects may additionally and/or alternatively include the sleeve having a second end, the bent seed precursor has a first end and a second end, the protruding being of a portion of the bent seed precursor proximate the first end of the bent seed precursor, the second end of the bent seed precursor captured by a slot of the sleeve.

Another aspect of the disclosure involves a casting method comprising: forming a seed, the seed having a first end and a second end and an inner diameter (ID) surface and an outer diameter (OD) surface; placing the seed second end in contact or spaced facing relation with a chill plate; contacting the first end with molten material; and cooling and solidifying the molten material so that a crystalline structure of the seed propagates into the solidifying material. The seed comprises at least one first piece and at least one second piece. The forming comprises inserting the at least one first piece into the at least one second piece, leaving the at least one first piece protruding from a first end of the at least one second piece. The contacting the first end with molten material contacts the molten material with the protruding at least one first piece.

A further embodiment of any of the foregoing embodiments or aspects may additionally and/or alternatively include the at least one second piece being a single full annulus piece.

A further embodiment of any of the foregoing embodiments or aspects may additionally and/or alternatively include the at least one first piece having multiple layers in a radial direction.

A further embodiment of any of the foregoing embodiments or aspects may additionally and/or alternatively include the multiple layers being formed by a spiral.

A further embodiment of any of the foregoing embodiments or aspects may additionally and/or alternatively include the multiple layers being formed by radially stacking separate pieces.

A further embodiment of any of the foregoing embodiments or aspects may additionally and/or alternatively include the at least one first piece being a single piece, the at least one first piece being bent into a bent condition, and the inserting being in the bent condition.

A further embodiment of any of the foregoing embodiments or aspects may additionally and/or alternatively include the at least one first piece being a plurality of pieces and the inserting comprising inserting each of the plurality of pieces into a slot of the at least one second piece.

A further embodiment of any of the foregoing embodiments or aspects may additionally and/or alternatively include the at least one first piece being an SX nickel-based superalloy and the at least one second piece not being an SX nickel-based superalloy.

A further embodiment of any of the foregoing embodiments or aspects may additionally and/or alternatively include the at least one second piece being an equiax nickel-based superalloy.

A further embodiment of any of the foregoing embodiments or aspects may additionally and/or alternatively include the at least one first piece being a Ni-based alloy and the at least one second piece being a steel.

Another aspect of the disclosure involves a casting method comprising: forming a seed, the seed having a first end and a second end and an inner diameter (ID) surface and an outer diameter (OD) surface; contacting the first end with molten material; and cooling and solidifying the molten material so that a crystalline structure of the seed propagates into the solidifying material. The forming comprises forming the seed with multiple layers in a radial direction.

A further embodiment of any of the foregoing embodiments or aspects may additionally and/or alternatively include the multiple layers being formed by a spiral.

A further embodiment of any of the foregoing embodiments or aspects may additionally and/or alternatively include the multiple layers being formed by radially stacking separate pieces.

A further embodiment of any of the foregoing embodiments or aspects may additionally and/or alternatively include the multiple layers being at least three layers at some given position.

A further embodiment of any of the foregoing embodiments or aspects may additionally and/or alternatively include the multiple layers forming a seed upper portion and the method comprising inserting the seed upper portion into a seed lower portion.

Another aspect of the disclosure involves a casting method comprising: forming a seed, the seed having a first end and a second end and an inner diameter (ID) surface and an outer diameter (OD) surface; placing the seed second end in contact or spaced facing relation with a chill plate; contacting the first end with molten material; and cooling and solidifying the molten material so that a crystalline structure of the seed propagates into the solidifying material. At least a portion of the seed contacted with the molten material has a solidus higher than a solidus of at least an initial pour portion of the molten material.

A further embodiment of any of the foregoing embodiments or aspects may additionally and/or alternatively include the solidus of the initial pour portion being lower than a solution temperature of said portion of the seed.

A further embodiment of any of the foregoing embodiments or aspects may additionally and/or alternatively include the solidus of the initial pour portion being at least 25° C. lower than the solution temperature of said portion of the seed.

A further embodiment of any of the foregoing embodiments or aspects may additionally and/or alternatively include the solidus of said portion of the seed being at least 25° C. higher than the solidus of the initial pour portion.

A further embodiment of any of the foregoing embodiments or aspects may additionally and/or alternatively include the solidus of said portion of the seed is at least 25° C. higher than the solidus of the initial pour portion.

A further embodiment of any of the foregoing embodiments or aspects may additionally and/or alternatively include the solidus of said portion of the seed being 25° C. to 200° C. higher than the solidus of the initial pour portion.

A further embodiment of any of the foregoing embodiments or aspects may additionally and/or alternatively include the seed and the molten material being nickel-based superalloys.

A further embodiment of any of the foregoing embodiments or aspects may additionally and/or alternatively include a subsequent pour portion of the molten material having a solidus higher than the solidus of the initial pour portion. After the solidifying, the initial pour portion and remainder of the seed are removed.

A further embodiment of any of the foregoing embodiments or aspects may additionally and/or alternatively include the solidus of the subsequent pour portion of the molten material being 25° C. to 200° C. higher than the solidus of the initial pour portion.

Another aspect of the disclosure involves a casting method comprising: forming a seed, the seed having a first end and a second end and an inner diameter (ID) surface and an outer diameter (OD) surface; placing the seed second end in contact or spaced facing relation with a chill plate; contacting the first end with molten material; and cooling and solidifying the molten material so that a crystalline structure of the seed propagates into the solidifying material. The forming of the seed includes applying a melting point depressant to a seed precursor along at least a portion of the seed contacted with the molten material.

A further embodiment of any of the foregoing embodiments or aspects may additionally and/or alternatively include the melting point depressant comprising boron. The melting point depressant produces a remelt temperature lower than a recrystallization temperature.

A further embodiment of any of the foregoing embodiments or aspects may additionally and/or alternatively include the melting point depressant being applied by vapor deposition.

A further embodiment of any of the foregoing embodiments or aspects may additionally and/or alternatively include the melting point depressant being applied by slurry coating.

A further embodiment of any of the foregoing embodiments or aspects may additionally and/or alternatively include the melting point depressant comprising a powder mixture of alloys of at least two different compositions.

A further embodiment of any of the foregoing embodiments or aspects may additionally and/or alternatively include the melting point depressant being applied on a compressively-strained inner diameter surface and a tensile strained outer diameter surface.

A further embodiment of any of the foregoing embodiments or aspects may additionally and/or alternatively include the melting point depressant being applied on a top surface.

A further embodiment of any of the foregoing embodiments or aspects may additionally and/or alternatively include the melting point depressant being effective to increase a height of melt back along at least one of an inner diameter surface and an outer diameter surface.

A further embodiment of any of the foregoing embodiments or aspects may additionally and/or alternatively include the seed precursor having a solidus no more than 25° C. higher, if at all, than a solidus of the molten material A further embodiment of any of the foregoing embodiments or aspects may additionally and/or alternatively include the seed precursor and the molten material being essentially identical compositions.

A further embodiment of any of the foregoing embodiments or aspects may additionally and/or alternatively include the seed precursor and the molten material being nickel-based superalloys.

A further embodiment of any of the foregoing embodiments or aspects may additionally and/or alternatively include the molten material solidifying as a full annulus component.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 14 is a view of a further seed.

FIG. 15 is a partial central vertical/axial sectional view of the seed of FIG. 14.

Like reference numbers and designations in the various drawings indicate like elements.

DETAILED DESCRIPTION

Figure 1:
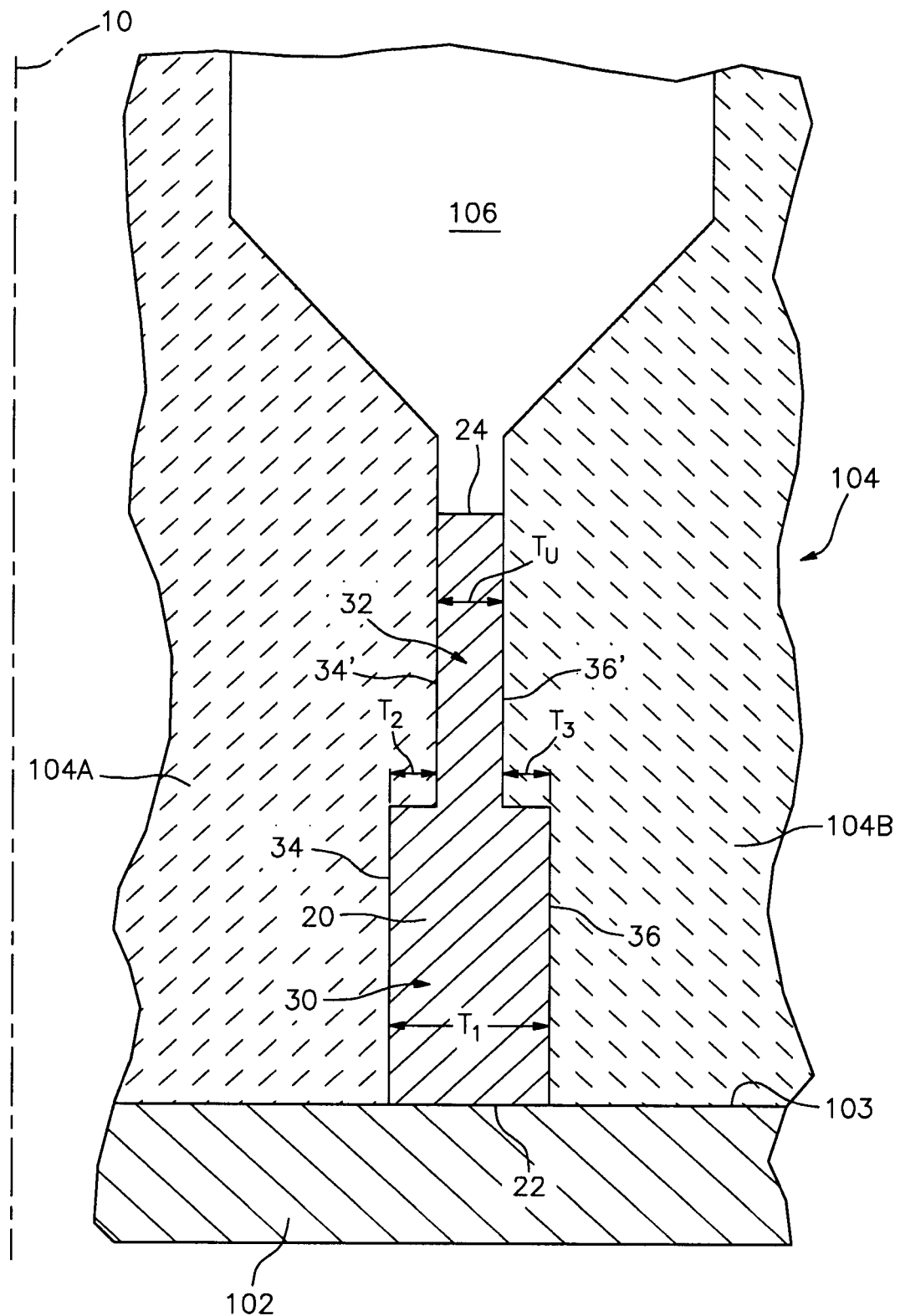
FIG. 1 is a partial central vertical/axial sectional view of a casting mold (shell) with a seed prior to an alloy pour.

When using a bent arcuate seed of a given alloy to cast that same alloy, recrystallization of the bent seed interferes with the successful casting of single-crystal (SX) and directionally solidified (DS) castings. The bending of the seed introduces stresses and strains across the seed thickness. Along an inner diameter (ID) depthwise region, the stresses and strains are principally compressive. Along an outer diameter (OD) depthwise region, the stresses and strains are principally tensile. The strains may include a substantial plastic component.

In casting, the bent seed has a tendency to recrystallize due to the plastic deformation. The recrystallized microstructure of the seed, in turn, propagates into the solidifying pour instead of the desired single-crystal structure.

Tables I and II below respectively identify temperature properties and nominal composition for exemplary nickel-based superalloys discussed below as seeds and/or castings. Such alloys typically have at least 45% Ni by weight (e.g., 48% to 65% or 50% to 65%). Typically, elements other than those listed in Table I will be up to 10.0 wt. % aggregate (more narrowly 5.0 wt. %) and up to 1.0% individually (more narrowly 0.5 wt. %). Minor elements in the table may, in various implementations, be present at higher levels such as for such other elements. Nevertheless, other alloys may be used.

TABLE I

Exemplary Alloy Properties

| Alloy | Solidus (° F. (° C.)) | Liquidus (° F. (° C.)) | Solution temperature (° F. (° C.)) |
|---|---|---|---|
| IN 718 | 2319-2224* (1271-1218) | 2437 (1336) | 1750 (954) |
| Alloy A | 2446 (1341) | 2511 (1377) | 2380 (1304) |
| Alloy B | 2382 (1306) | 2485 (1363) | 2387 (1308) |
| Alloy C | 2271 (1244) | 2543 (1395) | 2286 (1252) |
| Alloy D | 2197 (1203) | 2481 (1361) | 2220 (1216) |
| Alloy E | 2188 (1198) | 2418 (1326) | 2050 (1121) |
| Alloy F | 2294 (1256) | 2511 (1377) | 2200 (1204) |
| Udimet ™ 720LI | 2105 (1151) | 2453 (1345) | 2075 (1135) |
| Alloy G | 2207 (1208) | 2374 (1301) | 2165 (1185) |

*Depending on particular commercial variety - highly dependent on boron content.

From Table I, it is seen that several of the example alloys have solution temperature higher than solidus while others have solution temperature lower than solidus.

TABLE II

Exemplary Alloy Nominal Composition (weight percent)

| Alloy | C | Si | Mn | P | S | Al | B | Co | Cr | Cu |
|---|---|---|---|---|---|---|---|---|---|---|
| IN 718 | 0.05 | 0.13 | 0.07 | <0.005 | 0.001 | 0.55 | 0.005 | 0.00 | 19.00 | 0.00 |
| Alloy A | 0.001 | <0.12 | <0.12 | <0.015 | <0.015 | 5.65 | 0.000 | 10.00 | 5.00 | 0.05 |
| Alloy B | 0.001 | <0.12 | <0.12 | <0.015 | <0.015 | 5.00 | 0.003 | 5.00 | 10.00 | 0.05 |
| Alloy C | 0.10 | 0.10 | 0.10 | 0.005 | 0.002 | 6.00 | 0.015 | 12.00 | 6.50 | 0.05 |
| Alloy D | 0.14 | 0.10 | 0.10 | 0.005 | 0.002 | 5.00 | 0.002 | 10.00 | 9.00 | 0.05 |
| Alloy E | 0.1 | <0.12 | <0.12 | <0.015 | <0.015 | 3.6 | 0.013 | 9.0 | 12.0 | <0.1 |
| Alloy F | 0.15 | 0.10 | 0.10 | 0.005 | 0.002 | 5.50 | 0.015 | 10.00 | 8.40 | 0.05 |
| UDIMET 720Li | 0.014 | 0.00 | 0.00 | 0.00 | 0.00 | 2.51 | <0.03 | 14.6 | 16.2 | 0.00 |
| Alloy G | 0.04 | <0.06 | <0.02 | <0.006 | 0.006 | 3.41 | 0.027 | 20.9 | 10.45 | <0.010 |

| Alloy | Fe | Hf | Mo | Nb | Ni | Re | Ta | Ti | V | W | Zr |
|---|---|---|---|---|---|---|---|---|---|---|---|
| IN 718 | 18.50 | 0.00 | 3.00 | 5.00 | 52.79 | 0.00 | 0.00 | 0.90 | 0.00 | 0.00 | 0.00 |
| Alloy A | 0.25 | 0.10 | 1.90 | 0.00 | 59.75 | 3.00 | 8.40 | 0.00 | 0.00 | 5.90 | 0.00 |
| Alloy B | 0.25 | 0.00 | 0.00 | 0.00 | 62.19 | 0.00 | 12.00 | 1.50 | 0.00 | 4.00 | 0.00 |
| Alloy C | 0.10 | 1.50 | 2.00 | 0.00 | 58.50 | 3.00 | 4.00 | 0.00 | 0.00 | 6.00 | 0.03 |
| Alloy D | 0.25 | 2.00 | 0.00 | 1.00 | 58.35 | 0.00 | 0.00 | 2.00 | 0.00 | 12.00 | 0.00 |
| Alloy E | <0.2 | <0.1 | 1.9 | 0.00 | Bal. | 0.00 | 5.0 | 4.1 | 0.00 | 3.8 | <0.02 |
| Alloy F | 0.25 | 1.40 | 0.70 | 0.00 | 59.07 | 0.00 | 3.10 | 1.10 | 0.00 | 10.00 | 0.06 |
| UDIMET 720Li | <0.2 | 0.00 | 2.9 | 0.00 | Bal. | 0.00 | 0.00 | 4.97 | 0.00 | 1.2 | <0.06 |
| Alloy G | 0.25 | <0.05 | 3.3 | 1.85 | Bal. | 0.00 | 4.40. | 3.00 | <0.1 | 2.00 | 0.00 |

Because recrystallization is a function of strain, the recrystallization temperature will vary between specific applications as a function of the strain state (gradient). The specific recrystallization temperature can be determined by exposing sections of the seed plate to higher temperatures in increments (e.g., 25° F. (14° C.)) until recrystallization is observed metallographically. Further testing with smaller increments may refine the result. Table I identifies a solution temperature which may be used to predict recrystallization properties (discussed below).

Figures 21, 22:
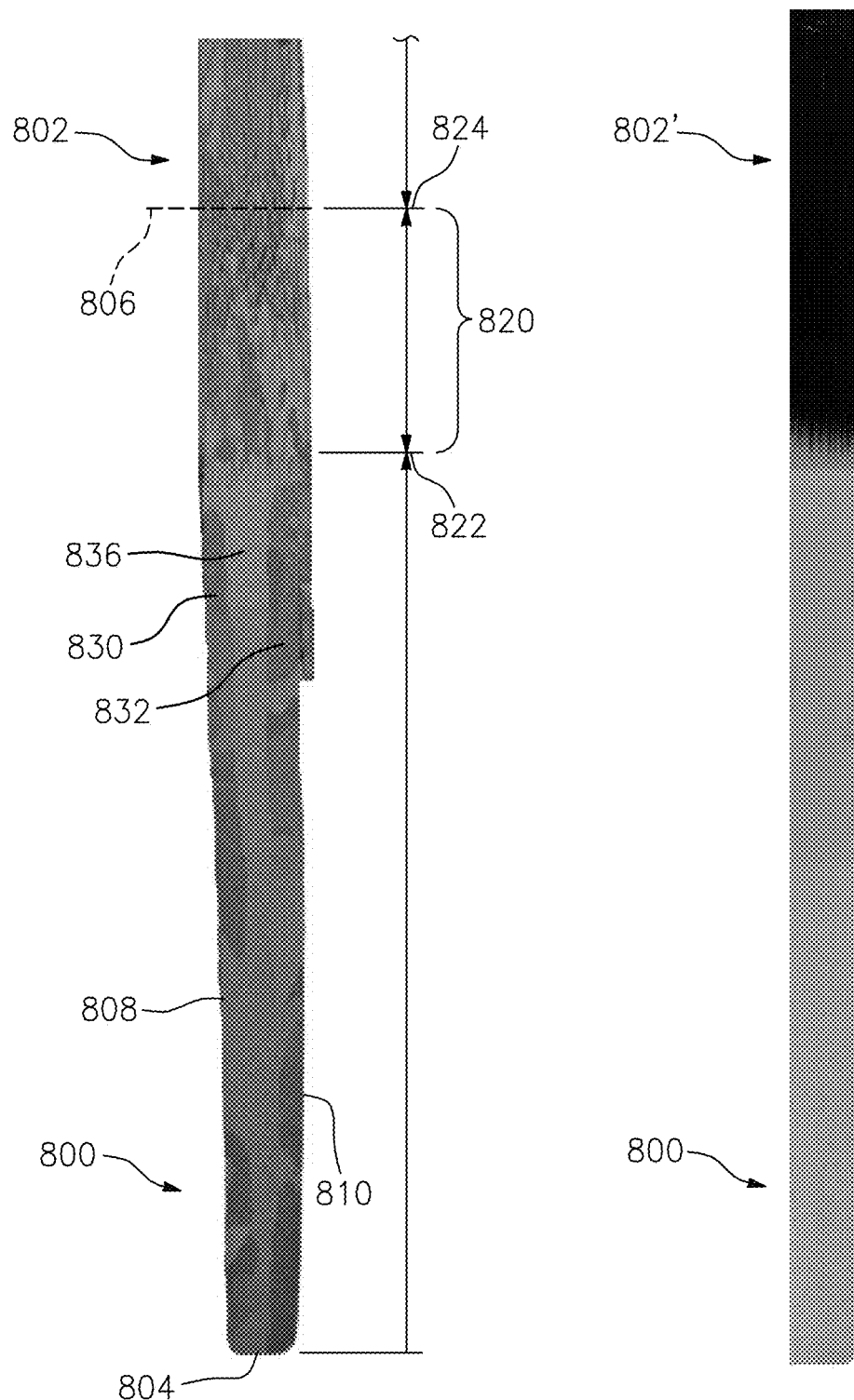
FIG. 21 is a partial micrograph of a baseline casting including seed remnant.
FIG. 22 is a partial micrograph of a second casting including seed remnant.

FIG. 21 shows an SX seed 800 of a first alloy after casting a body 802 of a second alloy. In this photo, both alloys are Alloy A. Prior to casting, the seed 800 extended from a lower end 804 to an upper end shown by dashed line 806. The seed had been bent to define an inner diameter (ID) surface 808 and an outer diameter (OD) surface 810 extending between the lower end and upper end.

A melt back region 820 extends between respective lower and upper limits 822 and 824. Below the melt back region, along both the aforementioned ID depthwise region and OD depthwise region are recrystallization zones 830 and 832 leaving a relatively unaffected region 836 radially in between. The two recrystallization zones 830 and 832 thus propagate the recrystallized structure up into the body 802 causing associated portions of the body 802 to lack the desired relatively pure microstructure of the original unaffected seed 800.

Several mechanisms are theorized for mitigating or avoiding this effect. A number of them involve modifying seed geometry/construction. Others involve seed material properties (meting/solidifying and recrystallization temperatures).

A first mechanism involves removing the strained/stressed regions after bending. This may involve removal of an entire layer (circumferential extent) in a vertical region expected to reach recrystallization temperature. Because the lower end of the seed contacts (or is in close facing relation to) the chill plate, only an upper portion should reach any relevant temperature. Thus, removal may be of an entire ID layer and an entire OD layer along an upper portion while leaving those layers along the lower portion.

FIG. 1 shows such a modified SX seed 20 extending from a lower end 22 to an upper end 24. The lower end rests atop an upper surface 103 of a chill plate 102 of a furnace (or is in close facing spaced relation). The seed 20 is laterally embedded in a ceramic shell 104 having an upper mold cavity 106 above the seed. A gap (not shown) may be engineered between the seed and chill plate to control heat transfer in at least some conditions (e.g., depending on the nature of the casting and the equipment). The exemplary seed 20 and shell 104 are generally (e.g., subject to segmentation issues discussed below) bodies of revolution about a vertical axis 10 (spacing not to scale). The exemplary shell 104 is a two-piece shell (with further pieces including pour cones, etc., if any, not shown) having an inner piece 104A concentrically surrounded by an outer piece 104B.

As discussed above, the seed has a lower portion or section 30 and an upper portion or section 32. The seed has an inner diameter (ID) surface and an outer diameter (OD) surface. Along the lower portion, the ID surface 34 is an intact portion of a surface of an original SX strip bent to form the seed. Similarly, along the lower portion, the OD surface 36 is an intact portion of the opposite face of the original SX strip. The original strip (seed precursor) thickness was $T_1$. Along the upper portion 32, the ID surface 34' and OD surface 36' have been relieved relative to the corresponding surfaces 34 and 36. Exemplary relief is shown by respective thicknesses $T_2$ and $T_3$ leaving a thickness $T_U$ remaining.

In exemplary embodiments where both $T_2$ and $T_3$ are nonzero, each are an exemplary at least 5% (more narrowly at least 10% or at least 20% or 5% to 35% or 10% to 30% or 20% to 50% (thus allowing for ID v. OD asymmetry of removal)) of the original thickness $T_1$. In other embodiments (not shown), only one of $T_2$ and $T_3$ is nonzero.

In absolute terms for typical part sizes in the range of 0.1 m to 2.0 m in diameter, exemplary $T_1$ is 2.0 mm to 20.0 mm (more particularly 2.0 mm to 10.0 mm) and exemplary $T_2$ and $T_3$ are at least 0.5 mm (more particularly 0.5 mm to 8.0 mm or 0.5 mm to 4.0 mm or 1.0 mm to 3.0 mm). Maximum diameter may be influenced by furnace availability with typical commercial furnaces able to go up to about 1.0 m.

Exemplary thinning is a machining such as electrical discharge machining (EDM), abrasive grinding, or high speed milling. Although the seed cavity of the FIG. 1 shell is stepped to closely accommodate the stepped seed, other configurations are possible. Due to the vertical thermal gradient, the warmer upper portion of the seed will tend to differentially thermally expand relative to the lower portion. Viewed in cross section, and relative to temperature before heating of the seed, due to the heating the upper portion of the seed will progressively flare radially outward from its junction with the lower portion to its upper end. The shell may be dimensioned to accommodate this flaring.

Figure 2:
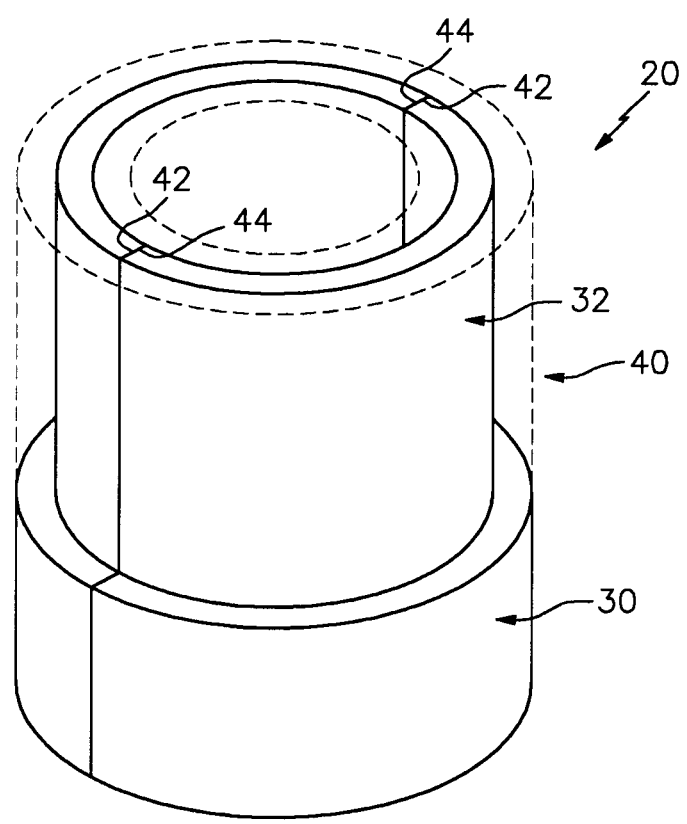
FIG. 2 is a view of the seed.

FIG. 2 shows the seed 20 formed as a segmented seed (circumferentially segmented) rather than a single-piece seed. Exemplary segmentation is in two 180° segments 40, each being a single bent SX piece. Exemplary segments 40 each have a first circumferential end 42 and a second circumferential end 44 with the two segments positioned end-to-end with adjacent ends contacting (or bonded to each other or closely spaced-apart). FIG. 2 also has a broken line showing of the original strip thickness along the upper portion 32. To hold the seed elastically strained, the pieces may be secured to each other along the lower portion 30 (e.g., a weld, braze, or diffusion bond at the mating ends 42 and 44 or fasteners).

Such a thinning to form the seed upper portion 32 may have an additional benefit of reducing stresses that the seed upper portion 32 applies to the shell 104 due to differential thermal expansion.

Figure 3:
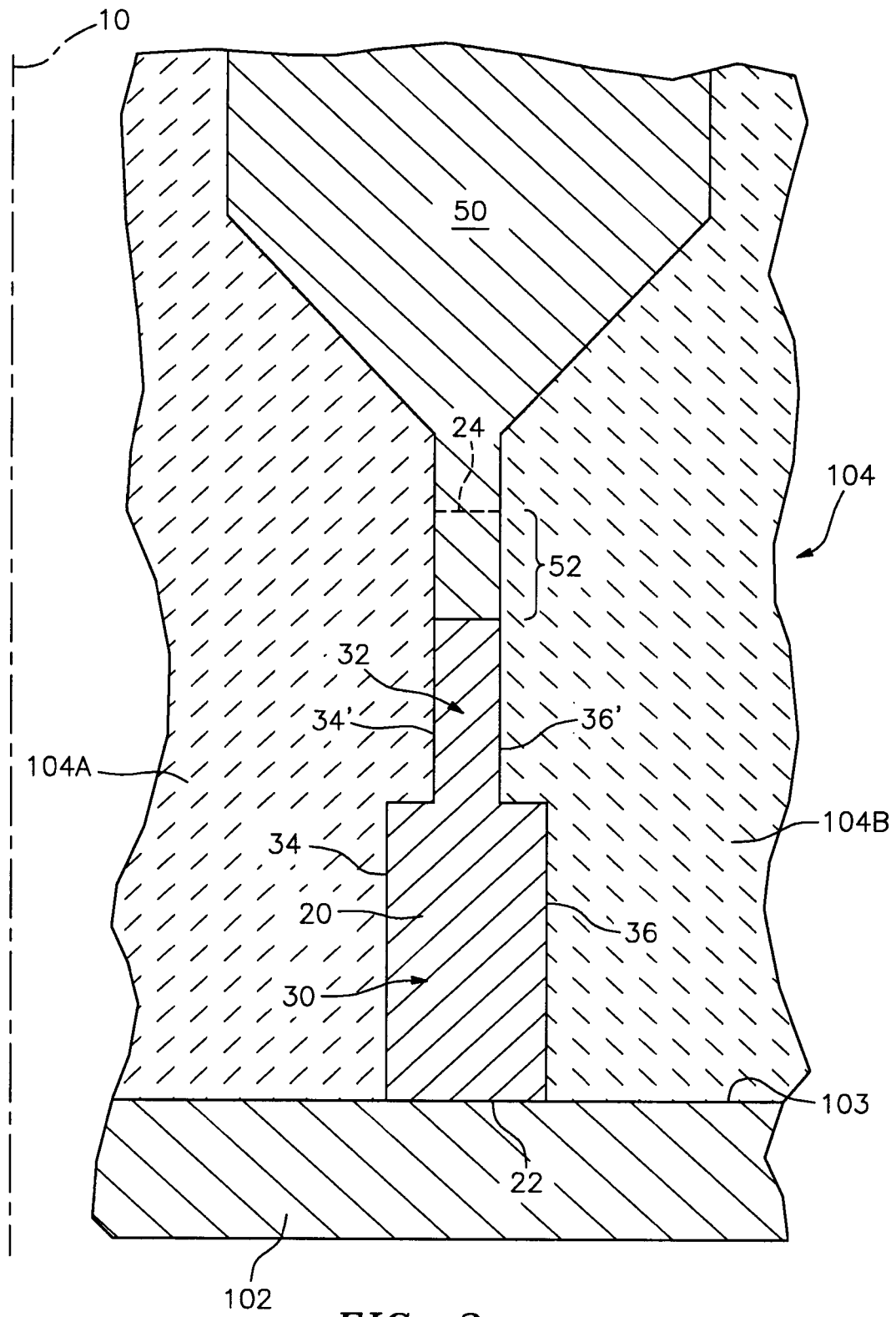
FIG. 3 is a view of the mold after the alloy pour.

FIG. 3 shows the shell 104 after casting with the body 50 of a second alloy cast in the mold cavity and showing the approximate extent of a melt back region 52. The seed alloy and second alloy may be the same or different. For example, IN 718 cast using an Alloy A seed.

Variations of the above methods providing similar structure (and thus not shown separately), are to eliminate the high stress/strain regions before bending. This may involve a thinning of a portion of the metallic strip to form what will become the seed upper portion 32. This leaves a relatively thick lower portion 30 for sufficient thermal mass and thermal contact with the chill plate. However, there are different considerations when making such a seed by pre-bending material removal. For a given $T_1$, $T_2$, and $T_3$, material removal pre-bending does not achieve an identical result to removing material post-bending.

Several considerations indicate that the pre-bending removal situation may leave higher magnitude stresses than the post-bending removal (if any). First, contact with bending tooling may impart stresses in contacted areas. Material from these areas is removed in the post-bending removal situation, but not the pre-bending removal. Second, even where $T_2$ and $T_3$ are effective to remove all stressed material (or material above given stress thresholds) in a post-bending removal, in a pre-bending removal $T_U$ is still great enough that bending creates stressed depthwise zones exceeding the thresholds. Thus, a pre-bending material removal may be associated with a smaller $T_U$ than is a post-bending material removal that produces a similar lack of recrystallized structure propagation. For this, exemplary $T_U$ in a pre-bending material removal is 20%-80% of the original thickness $T_1$, more particularly 20% to 50%.

This consideration of pre-bending removal v. post-bending removal highlights the possibility of a full height post-bending removal by the thicknesses $T_2$ and $T_3$ providing benefit.

A second mechanism is to relieve stress by more selectively removing material from the strained/stressed regions. In one example (FIG. 4) of an SX seed 200 (one-piece or segmented—a two-segment example shown), a circumferential array of axial grooves or slits 202 may be machined through one or both of the ID and OD strained/stressed regions. This allows relaxation of depthwise surface regions of intact material 204 circumferentially between the grooves. As with the seed 20, the grooves may only be partial height (limited to upper portion or section 210 thereby providing maximum surface area of bottom of the lower portion or section 212 in contact with the chill plate).

Figure 4:
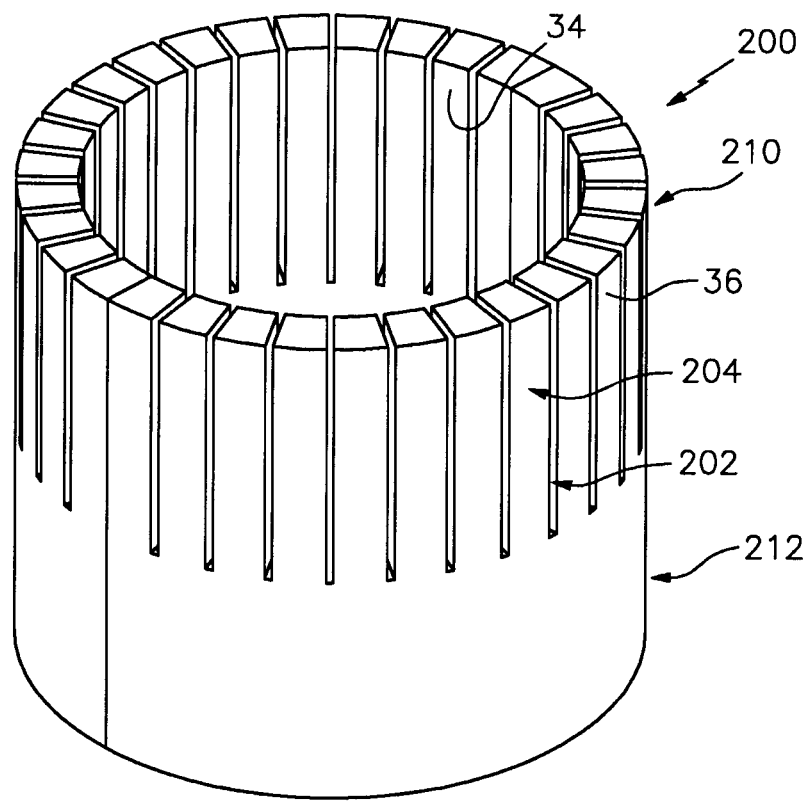
FIG. 4 is a view of an alternative seed
Figure 5:
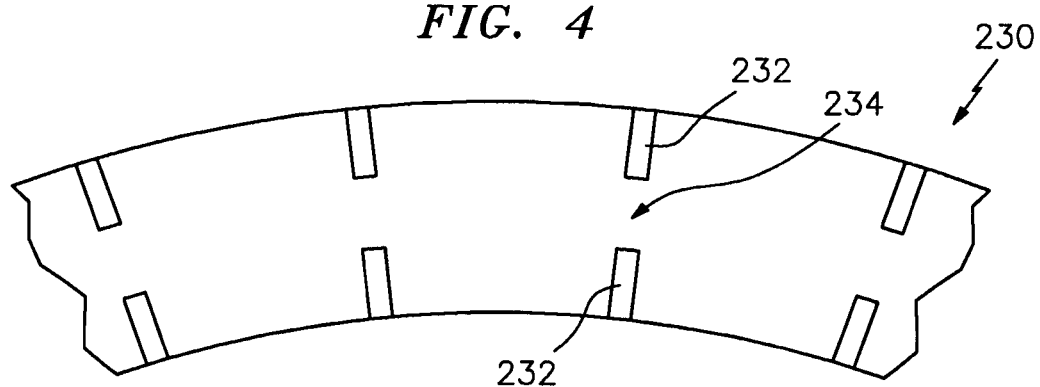
FIG. 5 is a top view of an alternative seed.

The FIG. 4 slits are through-slits (e.g., through-sawn or EDM). Alternatively to through-cutting, the grooving may leave a web of material (e.g., thickness similar to the portion 32 or smaller). FIG. 5 is a partial top view of such a seed 230 otherwise similarly formed to the seed 200 showing grooves 232 (shown both ID and OD, but may be on only one of the two) leaving webs 234 between intact material.

Figure 6:
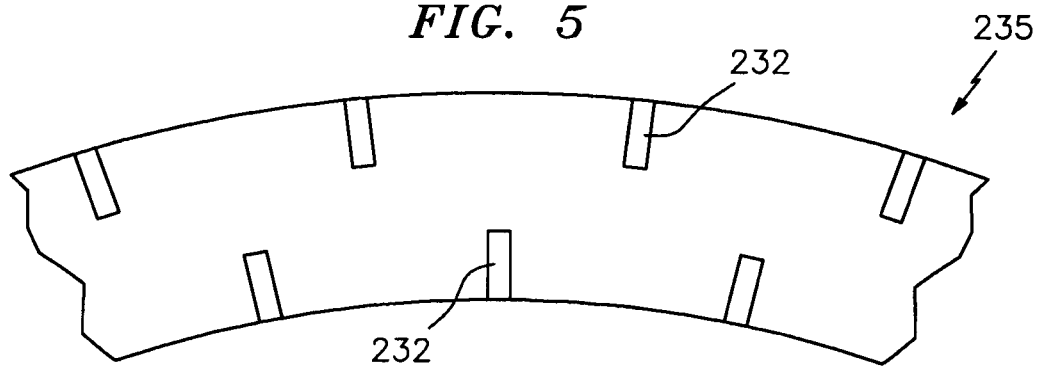
FIG. 6 is a top view of an alternative seed.

Alternative embodiments with grooves both ID and OD could have them circumferentially offset or staggered (e.g., FIG. 6 seed 235 where each ID groove is circumferentially intermediate the two adjacent OD grooves and vice versa). The grooves 232 may be full height (to ease bending if formed prior to bending) or may be just partial height.

Exemplary partial depth grooving is a machining such as electrical discharge machining (EDM), abrasive grinding, or high speed milling.

As noted relative to FIG. 6, other variations (not shown separately), are to similarly slit (FIG. 4) or groove (FIG. 5) before bending. This reduces the strain/stress on bending. The bending may fully or partially close the original grooves or slits. It may be preferable to cut the slits 202 or grooves 232 before bending because more strain/stress will be prevented by this than will be relieved by a post-bending slitting. Because the lower portion is below the ultimate melt back region, it is acceptable for the lower portion to have unrelieved depthwise plastically stressed/strained regions along the ID surface 34 and OD surface 36.

A third mechanism may alternatively involve using a thin sheet/strip and mating it to a thicker piece. The thin sheet/strip, once bent, forms the seed upper portion while the thicker piece (and lower portion of the strip) form the seed lower portion. Held in this manner the thinner piece is elastically deformed, but in an exemplary embodiment is not plastically deformed. Lacking plastic deformation, the driving force for recrystallization is removed. In one example, a seed 250 (FIG. 7) is formed from a full annulus thick lower piece 252 (or multiple circumferential segments fastened end-to-end) and a single thin bent strip upper piece 254. The lower piece 252 (FIG. 8) extends from a lower end 260 to an upper end 262 and has an inner diameter (ID) surface 264 and an outer diameter (OD) surface 266. Similarly, the upper piece 254 extends from a lower end 270 to an upper end 272 and has an inner diameter (ID) surface 274 and an outer diameter (OD) surface 276.

Figure 7:
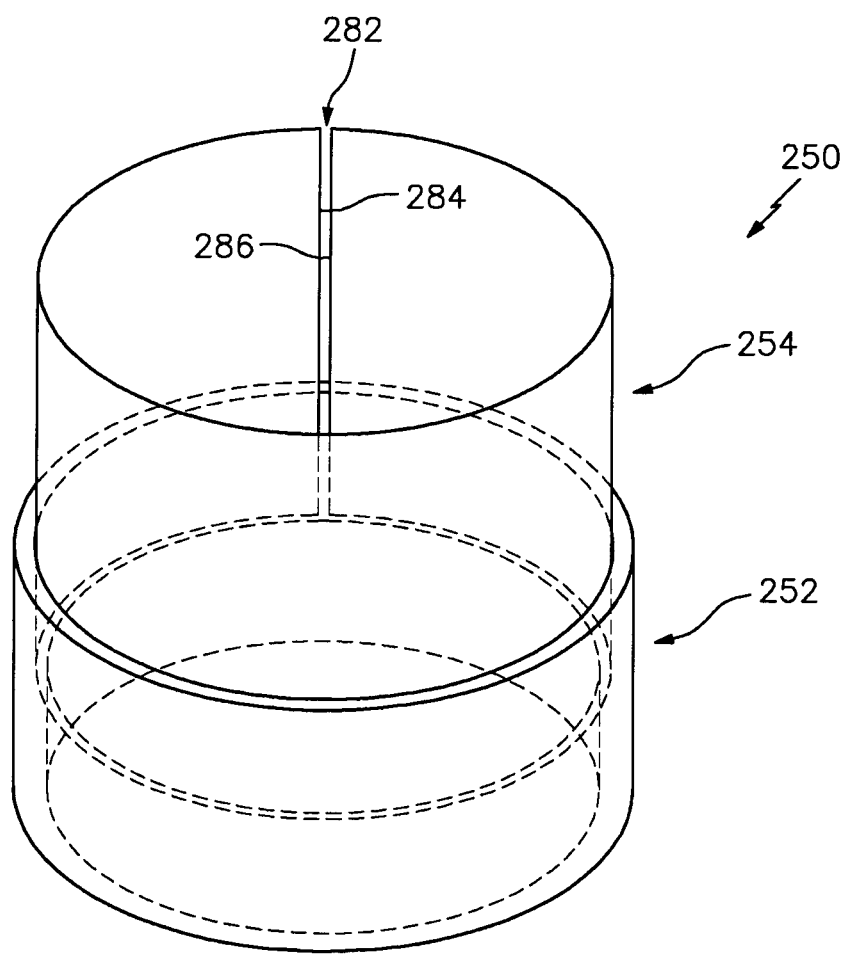
FIG. 7 is a view of an alternative seed.
Figure 8:
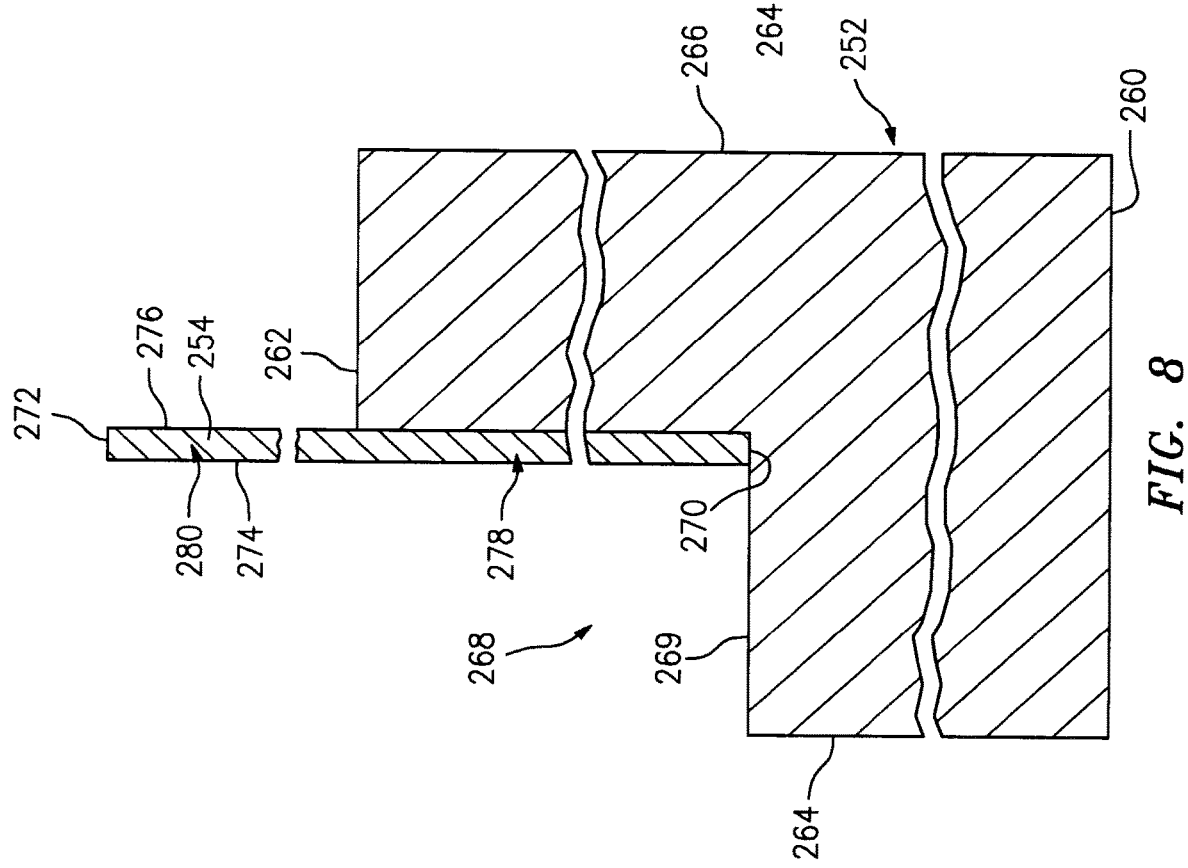
FIG. 8 is a partial central vertical/axial sectional view of the seed of FIG. 7.

The upper piece 254 mounts within the lower piece 252 (e.g., so that the lower piece, via hoop stress, retains the upper piece in its circular footprint). A lower portion 278 of the upper piece 254 is received within the lower piece and an upper portion 280 protrudes above the lower piece upper end 262. FIG. 7 shows a small gap 282 between circumferential ends 284 and 286 of the upper piece 254. In the exemplary embodiment of the seed 250, the lower piece 252 ID surface has an upper rebate 268 (defining shoulder 269) to radially receive the upper piece 254 lower portion 278.

Figure 9:
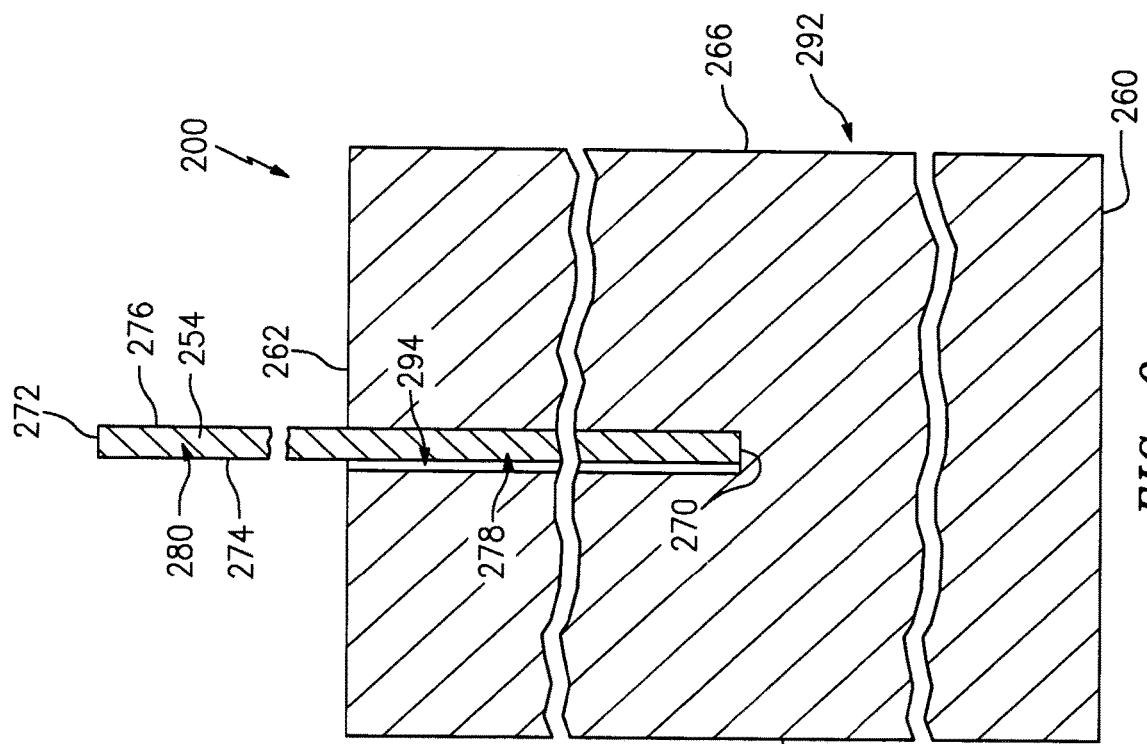
FIG. 9 is a partial central vertical/axial sectional view of a first variation on the seed of FIG. 7.

Alternative embodiments may replace the rebate/shoulder with a slot 294 (FIG. 9 in lower piece 292 of seed 290). Slot radial span may be slightly greater than upper piece thickness to allow ease of insertion while holding the upper piece elastically strained/stressed.

The upper piece 254 may be relatively thin. Exemplary thickness is 0.008 inch (0.20 mm), more broadly 0.003 inch to 0.10 inch (0.076 mm to 2.5 mm) or 0.005 inch (0.13 mm) to 0.05 inch (1.3 mm).

Figure 10:
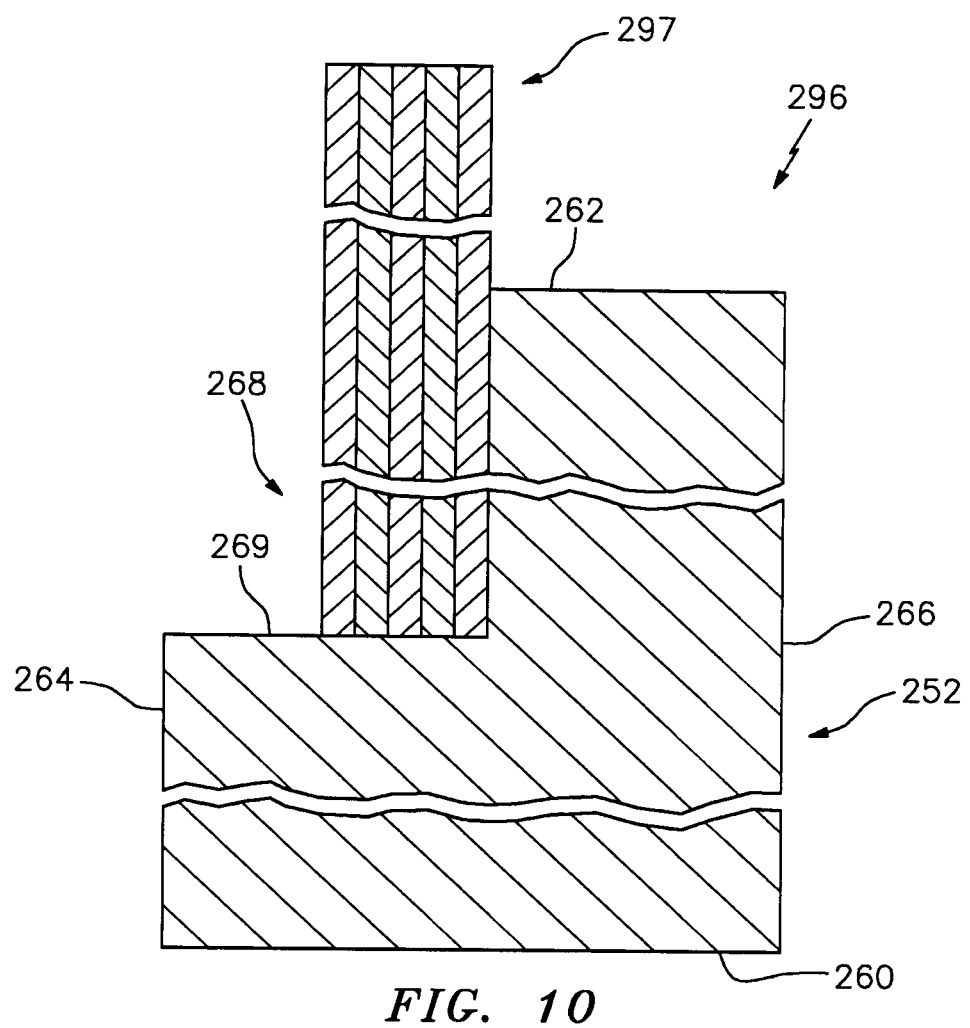
FIG. 10 is a partial central vertical/axial sectional view of a second variation on the seed of FIG. 7.
Figure 11:
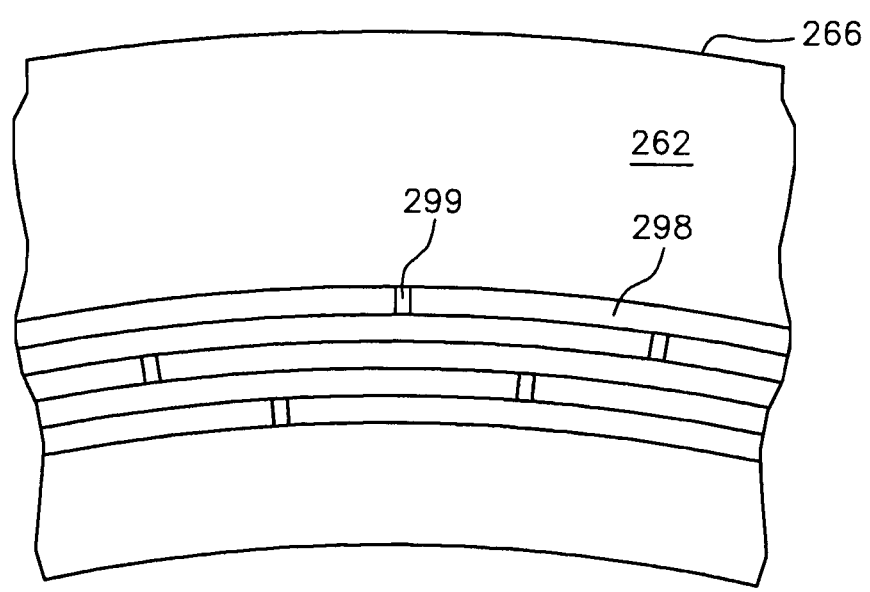
FIG. 11 is a partial top view of the seed of FIG. 10.
Figure 12:
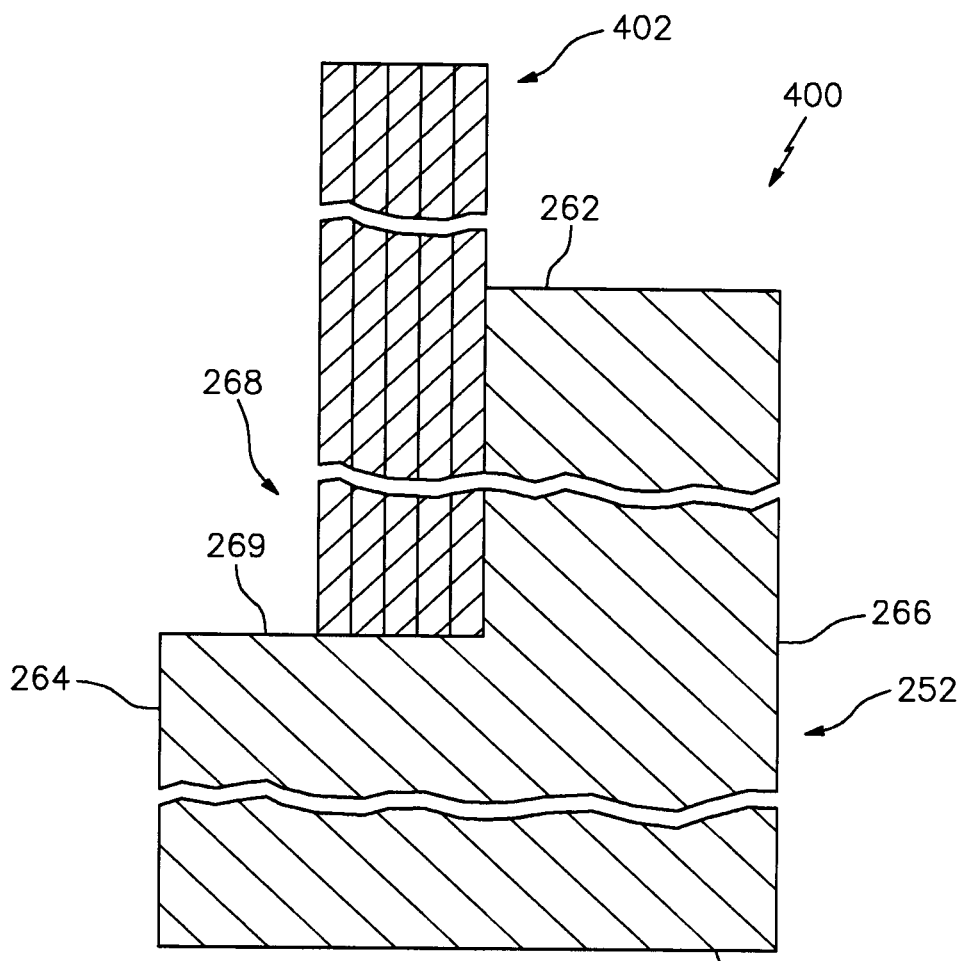
FIG. 12 is a partial central vertical/axial sectional view of a third variation on the seed of FIG. 7.
Figure 13:
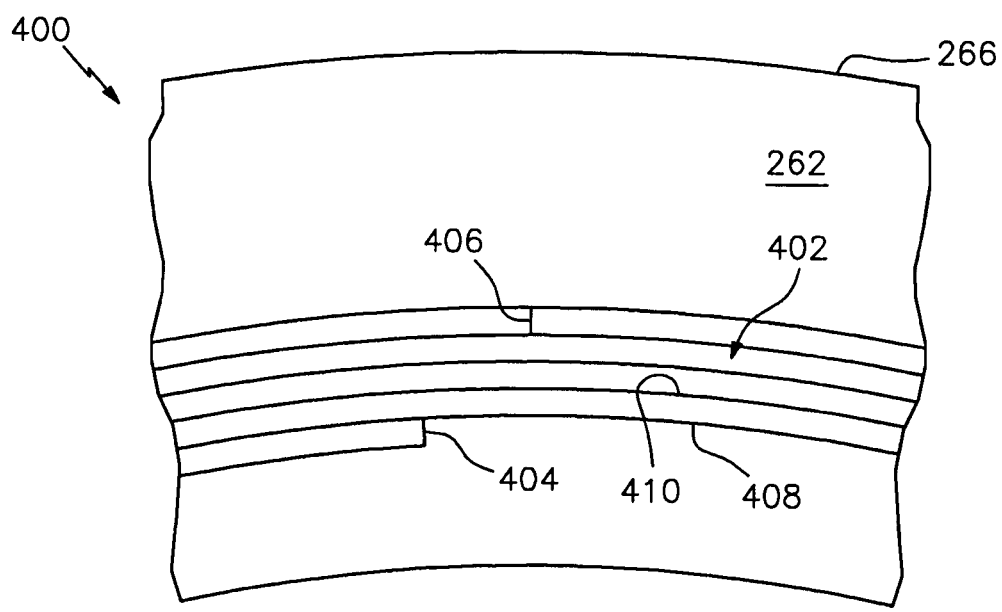
FIG. 13 is a partial top view of the seed of FIG. 12.

The thin, elastically held, SX seed piece 254 may be a single SX piece/layer. Alternatively, multiple layers may be built up in one or more SX pieces radially stacked to align crystalline axes (FIGS. 10 and 11 show seed 296 having multi-layer upper piece 297 as a variation on FIG. 8—a similar variation on FIG. 9 could be made). Exemplary alignment of the layer orientations should be less than 8.0° or, preferably less than 6.0° or less than 4.0°. A one-piece, multiple-layer, construction (not shown) could be a spiral (FIGS. 12 and 13 show seed 400 having spiral upper piece 402—e.g., cut from a larger stock SX coil to form a spiral having an inner end 404, an outer end 406, an inner diameter (ID) surface or face 408, and an outer diameter (OD) surface or face 410). A concentric radial stack could have each piece 298 (FIG. 11) forming one layer with the gaps 299 of each piece/layer circumferentially offset from gaps of the other piece(s)/layer(s) to provide good seeding along the full circumference. Alternatively, each layer may be multiple end-to-end pieces. A hybrid could involve a spiral formed from end-to-end segments that might each be over 360° or well under 360°. The spiral or concentric radial stack of pieces may define an exemplary two to fifty layers (turns for a spiral), more narrowly two to ten or two to five or three to five or at least two or at least three. This allows buildup to a greater total seed thickness than could otherwise be provided maintaining elastic bending. Such a buildup may be up to near the full thickness of the lower piece 254.

Alternative built-up seeds (not shown) could avoid the lower piece altogether (e.g., a spiral or stack alone held together by a weld or braze or fastener).

Combined dimensions of the lower portion 278 and lower piece 254 may correspond to those of the lower portion 30 of the seed 20. However, manufacturing considerations may provide more flexibility in going beyond either end of that range.

The upper piece 254 and lower piece 252 may be the same material or different. One example has the lower piece formed by machining such as high speed milling; whereas the upper piece is a bent SX strip. The lower piece may differ from the upper piece in chemistry or crystalline structure. For example, the lower piece may be a non-SX structure (e.g., machined from billet or equiax cast to final or near final shape) of the same material as the upper piece. It is seen that use of such different techniques allows the lower piece to be relatively thick without the same extent of machining required for a single-piece embodiment.

The lower holding ring is most ideally a non-single crystal piece of material machined into shape. Many materials could serve this role with varying advantages or disadvantages. More generally, a nickel-based non-single crystal alloy lower piece such as IN 718 could be used for SX upper pieces formed of other nickel superalloys due to its reasonable cost and near match to the SX piece(s) in thermal expansion properties. Use of the same alloy for both sections would provide essentially perfect match for thermal properties but be more expensive than using a more common equiax nickel alloy such as IN718.

Alternatively, to minimize cost, a steel lower piece could be used (e.g., stainless such as 304 stainless). This would be low cost but would have a thermal expansion mismatch with the SX nickel-based superalloy upper piece(s). Alternatively, to maximize conductivity from seed to chill plate, a copper (or other high thermal conductivity) lower piece may be used. This would have the disadvantage of thermal expansion mismatch relative to the SX piece, but would provide very high thermal conductivity from the chill plate to seed. Ultimately, choice of material for lower piece, including dimensions, will depend on details of the part being cast and equipment being used for casting.

A fourth mechanism may combine some form of segmentation of an upper member with a lower member. In one example, a seed 300 (FIG. 14) is formed from a full annulus thick lower piece 302 and a circumferential array of SX upper pieces 304. The upper pieces combine to form a fully segmented upper member 306. In the illustrated embodiment, adjacent pieces 304 may contact each other (e.g., may be cut as slight trapezoids for flat contact). In some embodiments (not shown), they are spaced apart by gaps. The associated shell may extend through the gaps to isolate the mold cavity from the lower piece 302.

The lower piece 302 extends from a lower end 320 to an upper end 322 and has an inner diameter (ID) surface 324 and an outer diameter (OD) surface 326. Similarly, each upper piece 304 extends from a lower end 330 to an upper end 332 and has an inner diameter (ID) surface 334 and an outer diameter (OD) surface 336. Each upper piece has a first lateral face 338 and a second lateral face 340.

The upper pieces 304 mount to the lower piece 302. A lower portion 342 (FIG. 15) of each upper piece 304 is received within a receiving feature 346 of the lower piece and an upper portion 344 protrudes above the lower piece upper end 322. In the exemplary embodiment, the receiving feature of the lower piece is a circumferential slot as in the FIG. 10 piece 292 separating ID and OD walls. An alternative feature (not shown) could be a shoulder. Or, the inner and outer walls could be separate pieces, leaving the lower ends to closely face or contact the chill plate upper surface.

A fifth mechanism involves relative solidus points and/or recrystallization points. The alloy to be cast may have its solidus (temperature at which melting occurs) lower than the temperature at which seed material would recrystallize. The goal is to avoid the pour causing an undesirable amount of seed recrystallization. The pour temperature will be above the solidus of the pour alloy. If the pour solidus is too much higher (if higher at all) than the solution temperature of the seed, there will be recrystallization. Recrystallization occurs when the alloy exceeds solution temperature. For example, FIG. 22 shows the Alloy A seed 800 used to cast IN 718 body 802'. Table I shows the IN 718 pour solidus as being slightly below the Alloy A seed solution temperature, thereby providing a sufficient margin to avoid undue recrystallization. In an ideal case one would expect solution temperature to be lower than solidus temperature of an alloy. Solution temperature is the temperature at which all the y' precipitates are dissolved and the alloy becomes a single phase y solid solution. Solidus temperature is the temperature at which the last fraction of liquid solidifies. Owing to unavoidable dendritic segregation during casting, the solidus is generally associated with the interdendritic region while the solution temperature is associated with the dendritic core. So, depending on the alloy compositions, in some alloys solution temperature may be higher than the solidus temperature by few (typically <25° F. (<14° C.)) degrees. The difference also depends on the experimental or theoretical model by which these numbers are determined or estimated, respectively.

The required criteria of relative solidus of casting alloy and recrystallization temperature of seed can be stated as the solidus of the cast alloy must be lower than the actual recrystallization temperature of the seed. While the recrystallization temperature can be estimated, the actual value for bent seed would be experimentally determined (e.g., testing on an actual bent seed or similar thickness of similarly bent material) and is likely to be much higher. But, for ease of estimate, one or more proxy temperature differences may be used.

One proxy involves pour solidus and seed solution temperature discussed above. Preferably the solidus should be lower than the solution temperature, more narrowly at least 45° F. (25° C.) lower. Upper limits on the range largely depend on the relative melting conditions allowing the seed to serve as a seed. A likely typical upper limit would be 80° C. However, greater deltas such as 200° C. are possible.

Alternatively or additionally, a proxy solidus delta may be used. Exemplary solidus delta between IN718 and Alloy A is at least 70° C., more particularly 70° C. to 125° C. A more generalized range comprehending other pairs may be at least 20° C. or at least 25° C. or at least 40° C., with any of those lower range ends associated with upper range ends, if any, of at most 100° C. or 150° C. or 200° C. With this in mind, it is seen that the prior mechanisms discussed above have particular use when this solidus/recrystallization or solidus/solidus relationship is not present.

A sixth mechanism, also utilizing relative solidus points and/or recrystallization points discussed above, is to use a sacrificial initial pour 910 (FIG. 16) to intervene between the seed 800 and the main pour 920 of material of the ultimate cast part. The relationship between the material properties of the sacrificial pour and both the seed and main pour may be similar to the examples above. The initial pour 910 (to a level or surface 912 and producing a first melt back zone 914 below the original seed upper surface 806 at seed height $H_S$) is at a temperature below the seed 800 recrystallization temperature. In general, the alloy of the initial pour will have a lower melting point (solidus) than the seed alloy; whereas the main pour alloy will have a higher melting point than the initial pour alloy. The seed and main pour may be, but need not be, the same alloy.

Figure 16:
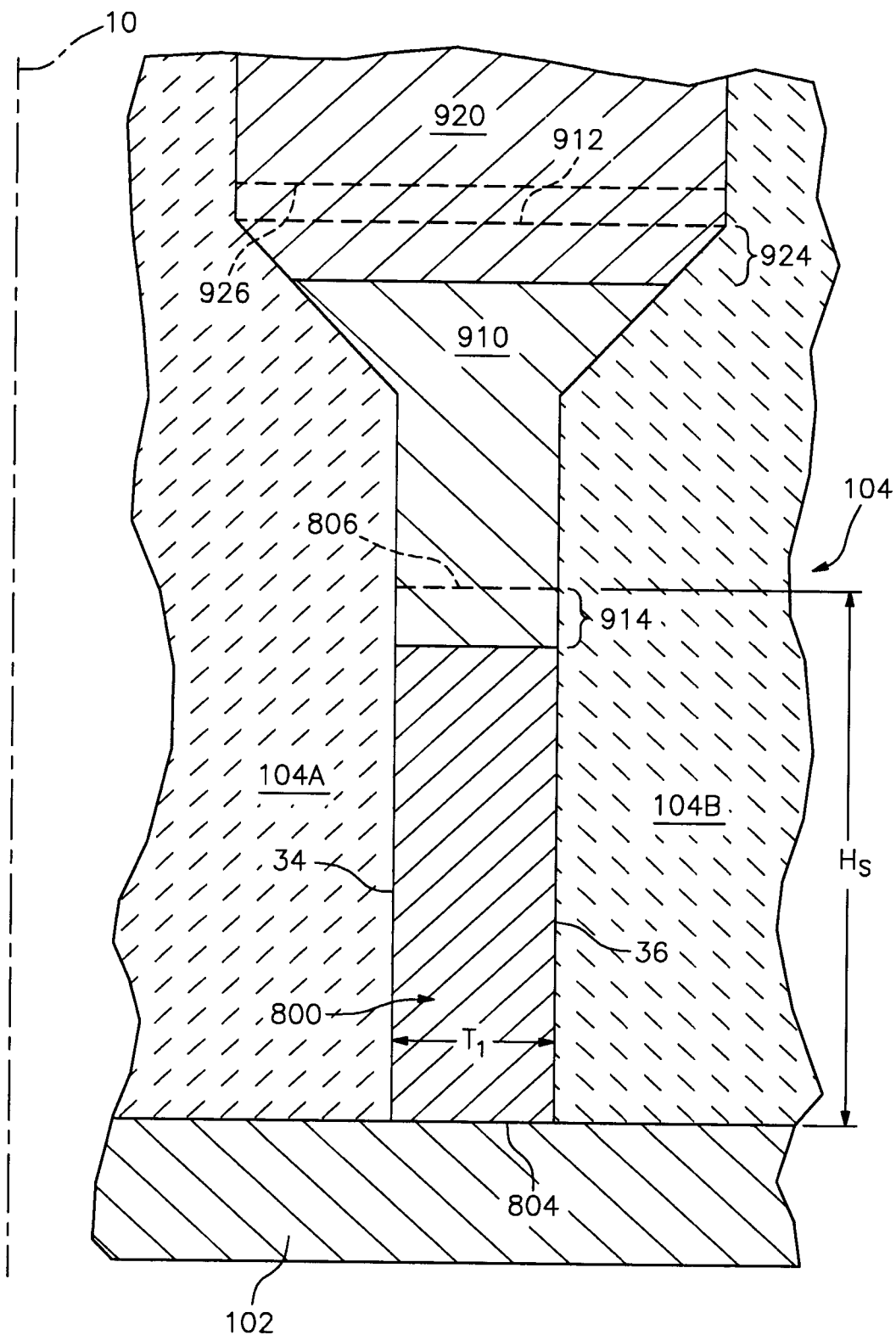
FIG. 16 is a partial central vertical/axial sectional view of a casting mold (shell) after a sacrificial pour and a main pour.

The progressive withdrawal from the furnace means that the initial pour will have partially solidified by the time the higher-temperature main pour 920 begins (producing second melt back zone 924). The solidified portion is relatively unstrained, so recrystallization is not an issue. FIG. 16 shows a cut-off level 926 within the main pour. After casting, material below the level 926 (i.e., including seed remnant and the initial pour material) is removed leaving the ultimate casting formed essentially (e.g., subject to minor diffusion, if any) by the main pour.

Although a single main pour 920 is shown, there may be multiple pours after the sacrificial initial pour 910 and these multiple pours need not have any special property relationship. Similar additional pours may attend embodiments described both above and below.

Figure 17:
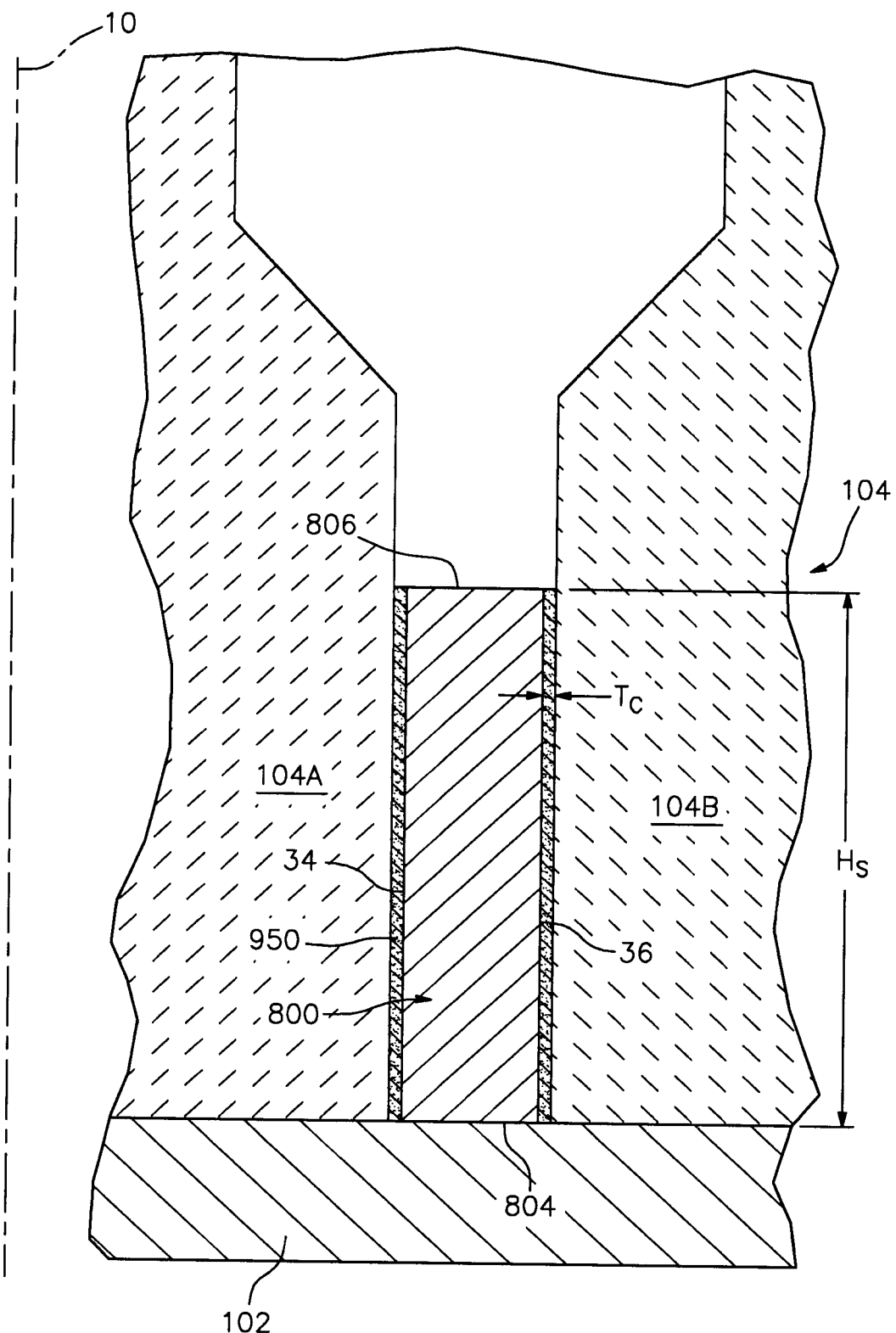
FIG. 17 is a partial central vertical/axial sectional view of a casting mold (shell) with a surface-treated seed prior to an alloy pour.
Figure 18:
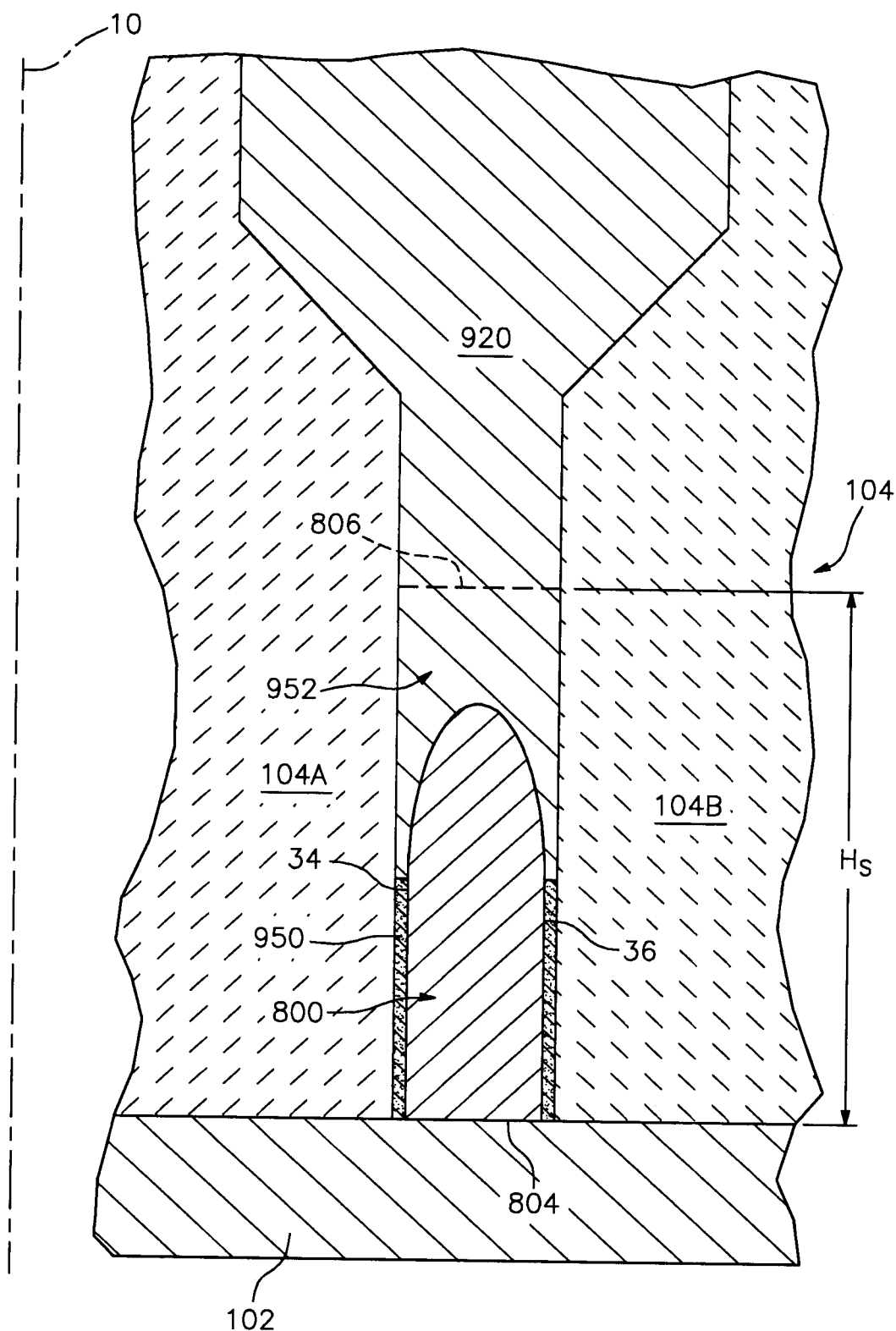
FIG. 18 is a view of the FIG. 17 mold after the alloy pour.

A seventh mechanism involves use of a melting point suppressant (depressant) 950 (FIG. 17) on the seed. As discussed further below, variations may involve one or both of affecting melting of the seed and solidification of the poured alloy. The FIG. 17 example is on both the ID and OD surfaces of a seed (base seed or seed substrate which may be the same as the seed 800 discussed above). Although initially counterintuitive relative to the examples above, the mechanism involves lowering melting temperature without similarly affecting recrystallization temperature. By reducing the solidus below recrystallization temperature, the seed will melt back beyond the recrystallization regions (melt back region 952 in FIG. 18). Thus, there is no recrystallization at the melt back front and the single crystal structure will propagate into the solidifying pour.

An exemplary suppressant 950 is or contains boron (e.g., a boron-rich nickel alloy). The suppressant may be applied to a seed precursor (e.g., base seed 800 or precursor thereof) surface such as via vapor deposition, thermal spray, or slurry coating (e.g., spraying, brushing, or dipping). Thickness $T_C$ of this layer will be a function of suppressant used and method of application. It may be atomic scaled for the case of PVD application of boron (e.g., up to about 50 micrometers, more narrowly 5.0 micrometers to 50 micrometers) or macroscopic and as thick as 0.5-3.0 mm in the case of slurry coating methods (e.g., of a powder form braze material).

One group of powder form braze materials for the layer 950 is self-braze materials. For self-brazing, it comprises a mixture of alloys of at least two different compositions. At least one of the alloys is a relatively low melting point (low melt) alloy and at least one of the alloys is a relatively high melting point (high melt) alloy. These alloys may themselves be nickel-based superalloys. The low melt alloy may comprise a relatively higher content of one or more elements acting as melting point suppressants/depressants (e.g., boron) than does the high melt alloy.

U.S. Pat. No. 8,075,662 (the '662 patent) of Minor et al., issued Dec. 13, 2011, the disclosure of which patent is incorporated by reference herein in its entirety as if set forth at length, discloses exemplary self-braze material formed of a mixture of powders of differing composition. Alternatively, just the high boron component of such a material could be used for the layer 950.

Figure 19:
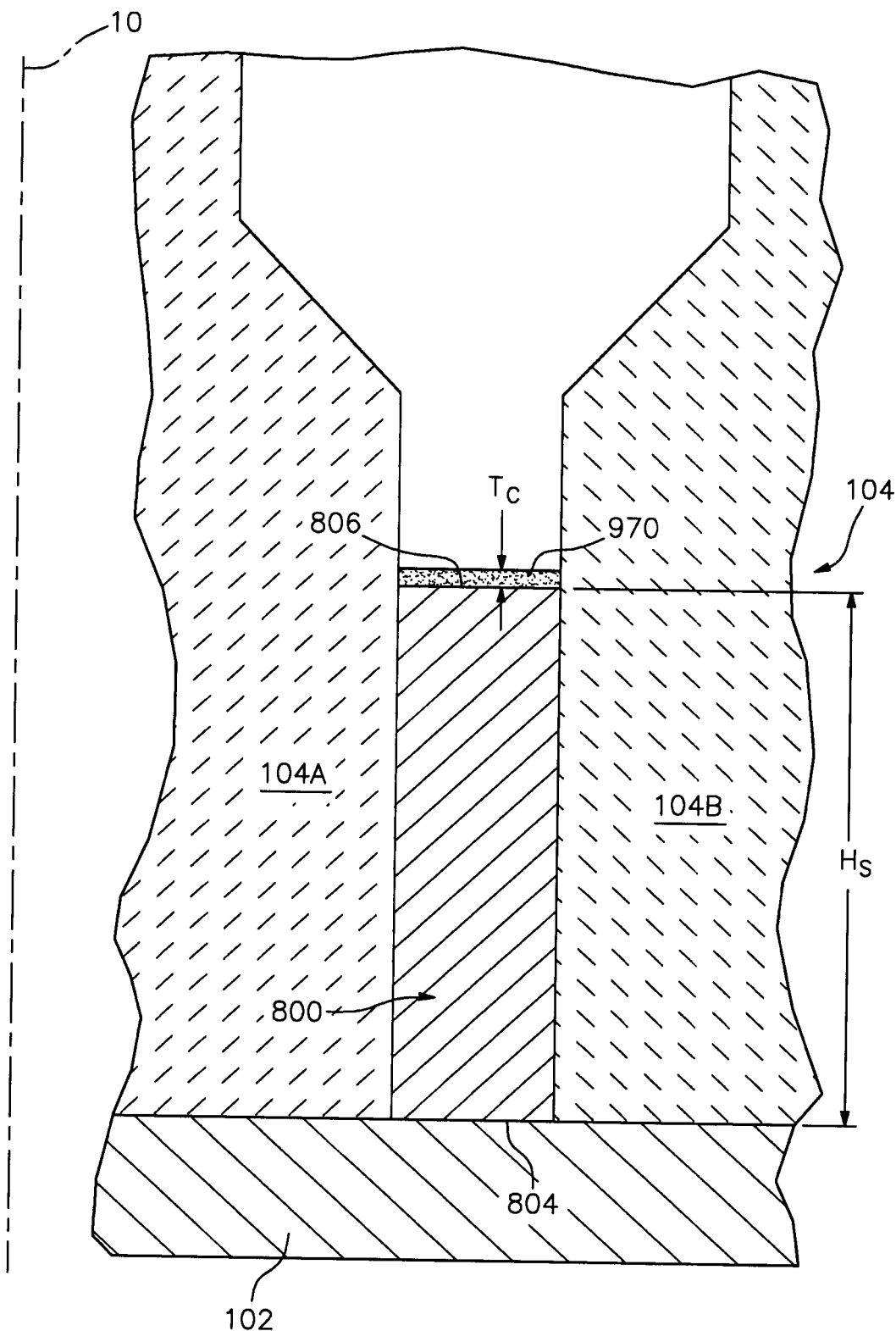
FIG. 19 is a partial central vertical/axial sectional view of a casting mold (shell) with a surface-treated seed prior to an alloy pour.

However, the effect on pour solidification may also be relevant. Melting point depression of the pour may effectively cause a high melting point pour alloy to behave as a low melting point alloy and not cause seed recrystallization. FIG. 19 shows a seed having a melting point suppressant/depressant 970 (e.g., as discussed above and to a similar thickness) atop the base seed 800. For example, the depressant 970 may be applied before or after insertion of the base seed 800 into the shell.

Figure 20:
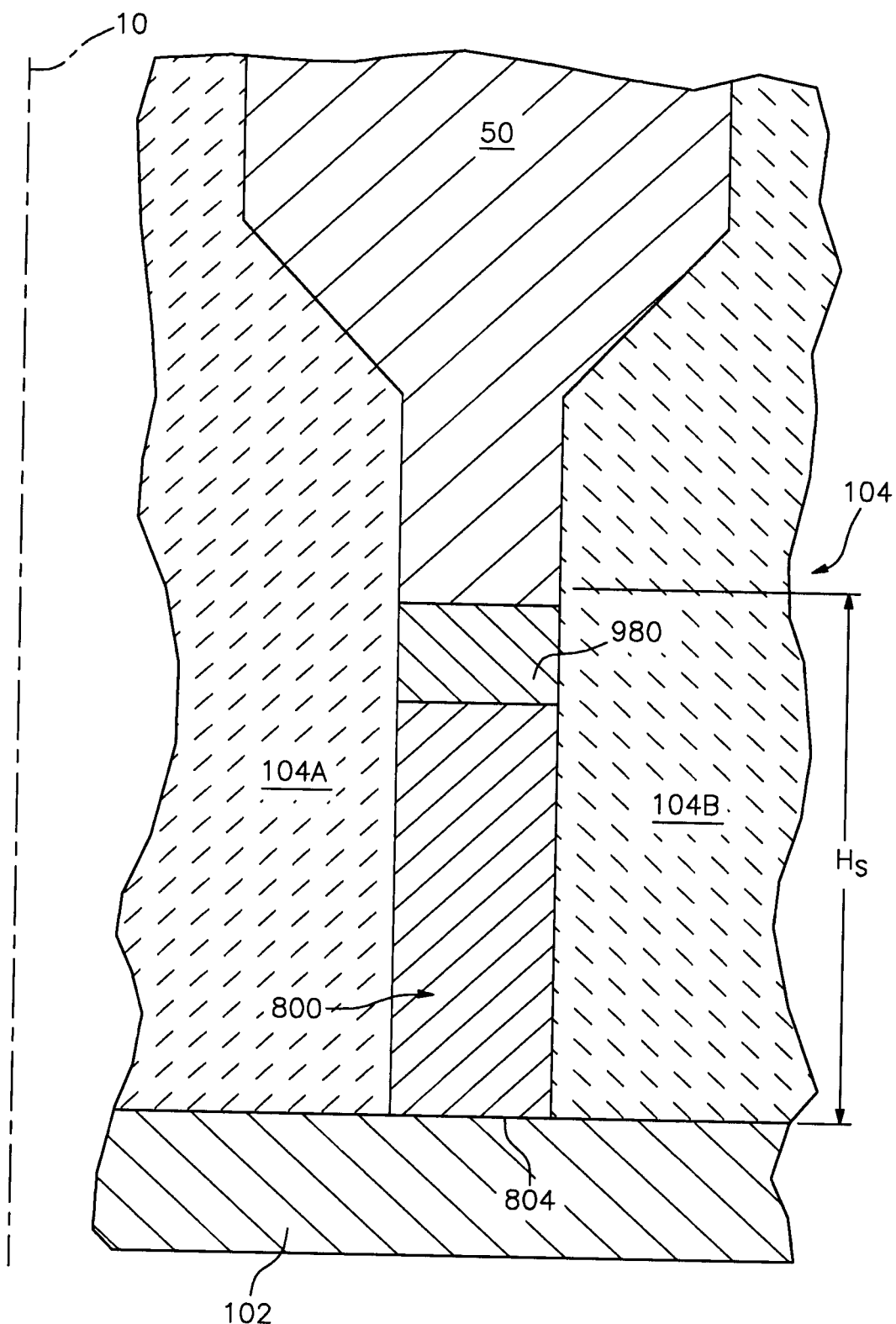
FIG. 20 is a view of the FIG. 19 mold after the alloy pour.

FIG. 20 shows a pour alloy whose normal solidus is higher than the base seed solution temperature. Upon contacting the depressant the depressant absorbs into the molten pour, reducing the pour solidus. The pour heats the remaining depressant and adjacent portion of the base seed. But this interaction cools the now solidus-depressed portion of the pour and melted portion of the base seed to a temperature below the base seed solution temperature, thereby avoiding recrystallization.

FIG. 20 shows a mixing zone 980 characterized by solidus depression (e.g., below the solidus of at least one of the base seed and pour alloy). The mixing zone upper end is shown at a level below the original top of the base seed. Above that is essentially pour alloy with a slight compositional gradient.

Although examples are illustrated in the context of casting a full annulus component, other arcuate components may similarly be cast from bent arcuate seed segments. For example, partial circumference cylindrical or frustoconical segments may be cast for subsequent circumferential assembly. Thus, the associated seeds may themselves be isolated arcuate segments rather than full or near essentially full annulus (integral/continuous annulus or segmented). Exemplary segments, when used, may be bent by at least 5° and amounts all the way up to and beyond 360° (e.g., 45° to 360° but many more times beyond 360° in the case of spirals).

Further variations may reflect variations discussed in the '625 patent. Further variations may involve recombining features of the individual described embodiments in any appropriate combination including combinations of the temperature delta manipulations and physical seed configurations and processing. For example, various of the physical seed configurations and processing steps may have particularly significant benefit when the seed and pour material is relatively thermally matched (e.g same material or material with close solidus-solidus or solidus-solutioning relationships). Nevertheless, the physical seed configurations and processing steps may also be used when the seed and pour has the greater difference in thermal properties discussed for the other embodiments.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline part configuration and/or casting process or apparatus, details of such baseline may influence details of particular implementations. Accordingly, other embodiments are within the scope of the following claims.

What is claimed is:

1. A casting method comprising:
   forming a seed, the seed having a first end and a second end and an inner diameter (ID) surface and an outer diameter (OD) surface;
   placing the seed second end in contact or spaced facing relation with a chill plate;
   contacting the first end with molten material; and
   cooling and solidifying the molten material so that a crystalline structure of the seed propagates into the solidifying material,
   wherein:
   at least a portion of the seed contacted with the molten material has a solidus higher than a solidus of at least an initial pour portion of the molten material;
   a subsequent pour portion of the molten material has a solidus higher than the solidus of the initial pour portion; and after the solidifying, the initial pour portion and remainder of the seed are removed from the subsequent pour portion.

2. The method of claim 1 wherein:

the solidus of the initial pour portion is lower than a solution temperature of said portion of the seed.

3. The method of claim 2 wherein:

the solidus of the initial pour portion is at least 25° C. lower than the solution temperature of said portion of the seed.

4. The method of claim 3 wherein:

the solidus of said portion of the seed is at least 25° C. higher than the solidus of the initial pour portion.

5. The method of claim 1 wherein:

the solidus of said portion of the seed is at least 25° C. higher than the solidus of the initial pour portion.

6. The method of claim 1 wherein:

the solidus of said portion of the seed is 25° C. to 200° C. higher than the solidus of the initial pour portion.

7. The method of claim 1 wherein:

the seed and the molten material are nickel-based superalloys.

8. The method of claim 1 wherein:

the solidus of the subsequent pour portion of the molten material is 25° C. to 200° C. higher than the solidus of the initial pour portion.

9. The method of claim 1 wherein:

the molten material solidifies as a full annulus component.

10. The method of claim 1 wherein:

the seed is a single crystal seed.

11. The method of claim 10 wherein:

the forming comprises bending.

12. The method of claim 11 wherein:

the solidus of said portion of the seed is at least 25° C. higher than the solidus of the initial pour portion.

13. The method of claim 12 wherein:

the molten material solidifies as a full annulus component.

14. The method of claim 1 wherein:

the forming comprises bending.

15. The method of claim 14 wherein:

the solidus of said portion of the seed is at least 25° C. higher than the solidus of the initial pour portion.

16. The method of claim 15 wherein:

the removing essentially leaves only the second pour portion.

17. The method of claim 16 wherein:

the molten material solidifies as a full annulus component.

* * * * *